US012771381B2

(12) United States Patent
Xu et al.

(10) Patent No.: US 12,771,381 B2
(45) Date of Patent: Oct. 20, 2026

(54) ENCODING METHOD AND APPARATUS, AND DECODING METHOD AND APPARATUS

(71) Applicant: HUAWEI TECHNOLOGIES CO., LTD., Shenzhen (CN)

(72) Inventors: Chen Xu, Hangzhou (CN); Rong Li, Hangzhou (CN); Tianhang Yu, Hangzhou (CN); Yunfei Qiao, Hangzhou (CN); Yingang Du, Shenzhen (CN); Lingchen Huang, Hangzhou (CN); Jun Wang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 1056 days.

(21) Appl. No.: 17/330,821

(22) Filed: May 26, 2021

(65) Prior Publication Data

US 2021/0279584 A1 Sep. 9, 2021

Related U.S. Application Data

(63) Continuation of application No. PCT/CN2019/120898, filed on Nov. 26, 2019.

(30) Foreign Application Priority Data

Nov. 27, 2018 (CN) ........................ 201811428115.5

(51) Int. Cl.
*H03M 13/00* (2006.01)
*G06F 17/16* (2006.01)
(Continued)

(52) U.S. Cl.
CPC ........ *H03M 13/6597* (2013.01); *G06F 17/16* (2013.01); *G06F 18/22* (2023.01); *G06N 3/045* (2023.01); *G06N 3/08* (2013.01)

(58) Field of Classification Search
CPC ......... G06F 17/16; G06F 18/22; G06N 3/045; G06N 3/08; H03M 13/6597
See application file for complete search history.

(56) References Cited

U.S. PATENT DOCUMENTS 5,134,396 A * 7/1992 Sirat .................. G06F 18/2135 341/51
5,659,309 A 8/1997 Takashi et al.
(Continued)

FOREIGN PATENT DOCUMENTS

CN 1119058 A 3/1996
CN 101997492 A 3/2011
(Continued)

OTHER PUBLICATIONS

Pfister, "A Brief Introduction to Polar Codes," 2017 (Year: 2017).*
(Continued)

*Primary Examiner* — Michael J Huntley
*Assistant Examiner* — Vincent Anton Spraul
(74) *Attorney, Agent, or Firm* — Fish & Richardson P.C.

(57) ABSTRACT

In one example encoding method, first input information is obtained. The first input information is encoded based on an encoding neural network to obtain and output first output information. The encoding neural network comprises a first neuron parameter, and the first neuron parameter is used to indicate a mapping relationship between the first input information and the first output information.

20 Claims, 11 Drawing Sheets

(51) Int. Cl.

| | |
|---|---|
| ***G06F 18/22*** | (2023.01) |
| ***G06N 3/045*** | (2023.01) |
| ***G06N 3/08*** | (2023.01) |

(56) References Cited

U.S. PATENT DOCUMENTS

| | | | | |
|---|---|---|---|---|
| 10,468,142 | B1 * | 11/2019 | Abou Shousha | A61B 3/102 |
| 2010/0161530 | A1 | 6/2010 | Petritis et al. | |
| 2014/0085447 | A1 * | 3/2014 | Lorach | A61F 9/08 348/62 |
| 2018/0060727 | A1 * | 3/2018 | Rainwater | G06N 3/045 |
| 2018/0174050 | A1 * | 6/2018 | Holt | G06N 3/0455 |
| 2018/0183464 | A1 * | 6/2018 | Ge | H03M 13/13 |
| 2018/0268595 | A1 | 9/2018 | Sarna et al. | |
| 2019/0188567 | A1 * | 6/2019 | Yao | G06N 3/082 |
| 2020/0099401 | A1 * | 3/2020 | Qin | G06N 3/045 |

FOREIGN PATENT DOCUMENTS

| | | | |
|---|---|---|---|
| CN | 105720992 | A | 6/2016 |
| CN | 107017892 | A | 8/2017 |
| CN | 107516110 | A | 12/2017 |
| CN | 108120451 | A | 6/2018 |
| CN | 108777584 | A | 11/2018 |
| CN | 108809506 | A | 11/2018 |
| CN | 108833313 | A | 11/2018 |
| EP | 0581828 | B1 | 1/1997 |
| WO | 2015157643 | A1 | 10/2015 |
| WO | 2018033206 | A1 | 2/2018 |

OTHER PUBLICATIONS

Friedland et al., "A Practical Approach to Sizing Neural Networks," Sep. 18, 2018, arXiv:1810.02328 (Year: 2018).*
Holdman, "Error-Correcting Codes Over Galois Rings," 2016 (Year: 2016).*
Gruber et al., "On Deep Learning-Based Channel Decoding," 2017, arXiv:1701.07738v1 (Year: 2017).*
Hendrycks et al., "Using Pre-Training Can Improve Model Robustness and Uncertainty," 2019, arXiv: 1901.09960v5 (Year: 2019).*
Wang, "Ricean K-factor Estimation based on Channel Quality Indicator in OFDM Systems using Neural Network," 2018, arXiv:1808.06537v1 (Year: 2018).*
Ypx, "What is pre training a neural network?" response, 2016 (edited Sep. 2018), https://stats.stackexchange.com/questions/193082/what-is-pre-training-a-neural-network (hereafter Ypx) (Year: 2018).*
Ye et al., "Polar Codes Using Dynamic Kernels," 2015, 2015 IEEE International Symposium on Information Theory (ISIT) (Year: 2015).*
Cheng et al., "Classification of Polarizing Matrices Based on Bhattacharyya Parameters," 2018, 12th IEEE International Conference on Anti-counterfeiting, Security, and Identification (ASID) (Year: 2018).*
Cammerer et al., "Scaling Deep Learning-based Decoding of Polar Codes via Partitioning," Globecom 2017—2017 IEEE Global Communications Conference, Dec. 2017, 6 pages.
Extended European Search Report issued in European Application No. 19890969.9 on Nov. 23, 2021, 12 pages.
Mühlenbein, "Limitations of multi-layer perceptron networks—steps towards genetic neural networks," Parallel Computing, vol. 14, No. 3, Aug. 1990, 12 pages.
Song et al., "A Graph-Neural-Network Decoder with MLP-based Processing Cells for Polar Codes," 11th International Conference on Wireless Communications and Signal Processing (WCSP), Oct. 2019, 7 pages.
Lyu et al, "Performance Evaluation of Channel Decoding With Deep Neural Networks," IEEE International Conference on Communications (ICC), Jan. 2018, 6 pages.
Office Action in Chinese Application No. 201811428115.5, dated May 6, 2021, 14 pages.
PCT International Search Report and Written Opinion in International Application No. PCT/CN2019/120898, dated Feb. 26, 2020, 17 pages.
Bioglio et al., "Minimum-Distance Based Construction of Multi-Kernel Polar Codes," CoRR, Sep. 4, 2017, arXiv:1701,07616v2, 6 pages.
Coppolino et al., "A Multi-Kernel Multi-Code Polar Decoder Architecture," CoRR, submitted on Feb. 2, 2018, arXiv:1802.00580v1, 10 pages.
EP Communication Pursuant to Article 94(3) EPC in European Appln. No. 19890969.9 , mailed on Dec. 5, 2024, 9 pages.

* cited by examiner

ENCODING METHOD AND APPARATUS, AND DECODING METHOD AND APPARATUS

CROSS-REFERENCE TO RELATED APPLICATIONS

This application is a continuation of International Patent Application No. PCT/CN2019/120898, filed on Nov. 26, 2019, which claims priority to Chinese Patent Application No. 201811428115.5, filed on Nov. 27, 2018. The disclosures of the aforementioned applications are hereby incorporated by reference in their entireties.

TECHNICAL FIELD

Embodiments of this application relate to the communications field, and in particular, to an encoding method and apparatus, and a decoding method and apparatus.

BACKGROUND

Currently, in an encoding/a decoding learning process in a conventional technology, an encoder/a decoder needs to learn a sample of entire codeword space. A code length increases due to an encoding particularity of polar code. Therefore, a quantity of code sequences in entire codebook space corresponding to the polar code increases exponentially. Therefore, in the conventional technology, when a quantity of information bits is relatively large, complexity of traversing the entire codeword space is greatly increased, and complexity of implementation is relatively high.

SUMMARY

This application provides an encoding method and apparatus, and a decoding method and apparatus, to weaken an impact of a code length on traversal in codeword space to some extent, thereby improving encoding/decoding learning efficiency.

To achieve the foregoing objectives, the following technical solutions are used in this application.

According to a first aspect, an embodiment of this application provides an encoding method. The method may include: obtaining first input information; and then, encoding the obtained first input information based on an encoding neural network, to obtain and output first output information. The encoding neural network includes a first neuron parameter. The first neuron parameter may be used to indicate a mapping relationship between the first input information and the first output information. The encoding neural network is obtained after an initial encoding neural network consisting of a first neural network unit is trained. The initial encoding neural network includes a second neuron parameter that may be used to indicate a mapping relationship between second input information input to the initial encoding neural network and second output information output by the initial encoding neural network. In addition, after the initial encoding neural network is trained, the second neuron parameter is updated to the first neuron parameter. The second neuron parameter consists of a third neuron parameter included in the first neural network unit. The third neuron parameter is used to indicate a mapping relationship between third input information input to the first neural network unit and third output information output by the first neural network unit. An error between the third output information and an expected check result of the third input information is less than a threshold. The expected check result of the third input information is obtained after a multiplication operation and an addition operation are performed on the third input information in a GF(2) based on a first kernel matrix. In the method, the first input information is to-be-encoded information, and the second input information and the third input information are training information.

In the foregoing manner, a large neural network is obtained after small neural network units are connected, so that in an encoding learning process, generalization can be implemented to entire codeword space by using a small learning sample.

In a possible implementation, a step of obtaining the first neural network unit may include: constructing a first initial neural network unit, and setting a first initial neuron parameter, where the first initial neuron parameter is used to indicate a mapping relationship between fourth input information input to a first initial neuron and fourth output information output by the first initial neuron, the first initial neuron parameter includes an initial weight value and an initial bias vector, the first initial neural network unit includes at least one hidden layer, each hidden layer includes Q nodes, Q is an integer greater than or equal to N, and N is a minimum value in a code length of the third input information and a code length of the third output information; training the first initial neural network unit based on the first initial neuron parameter until an error between the fourth output information and an expected check result of the fourth input information is less than a threshold, where the expected check result of the fourth input information is obtained after a multiplication operation and an addition operation are performed on the fourth input information in the GF(2) based on the first kernel matrix; and when the first initial neural network unit is trained, updating the first initial neuron parameter to obtain the third neuron parameter, where the fourth input information is training information.

In the foregoing manner, an initial neural network unit is generated based on the first kernel matrix, and then the initial neural network unit is trained to generate a neural network unit corresponding to the first kernel matrix.

In a possible implementation, the first kernel matrix is $$\begin{bmatrix} 1 & 0 \\ 1 & 1 \end{bmatrix},$$

or the first kernel matrix is $$\begin{bmatrix} 1 & 1 & 1 \\ 1 & 0 & 1 \\ 0 & 1 & 1 \end{bmatrix}.$$

In the foregoing manner, corresponding neural network units are generated based on kernel matrices with different structures.

In a possible implementation, if the first kernel matrix is $$\begin{bmatrix} 1 & 0 \\ 1 & 1 \end{bmatrix},$$

the expected check result of the third input information is $x_0=u_0\oplus u_1$ and $x_1=u_1$, where $x_0$ and $x_1$ are the third output information, and $u_0$ and $u_1$ are the third input information; or if the first kernel matrix is $$\begin{bmatrix} 1 & 1 & 1 \\ 1 & 0 & 1 \\ 0 & 1 & 1 \end{bmatrix},$$

the expected check result of the third input information is $x_0=u_0 \oplus u_1$, $x_1=u_0 \oplus u_2$, and $x_2=u_0 \oplus u_1 \oplus u_2$, where $x_0$, $x_1$, and $x_2$ are the third output information, and $u_0$, $u_1$, and $u_2$ are the third input information.

In the foregoing manner, corresponding neural network units are generated based on kernel matrices with different structures.

In a possible implementation, the initial encoding neural network consists of the first neural network unit and a second neural network unit. The second neural network unit includes a fourth neuron parameter. The second neural network unit is obtained after the first initial neural network unit is trained. The first initial neuron parameter is updated after the first initial neural network unit is trained, to obtain the fourth neuron parameter. The fourth neuron parameter is different from the third neuron parameter.

In the foregoing manner, the encoding neural network having different neuron parameters and including neural network units with the same structure is implemented.

In a possible implementation, the initial encoding neural network consists of the first neural network unit and a third neural network unit. The third neural network unit includes a fifth neuron parameter. The fifth neuron parameter is used to indicate a mapping relationship between fifth input information input to the third neural network unit and fifth output information output by the third neural network unit. An error between the fifth output information and an expected check result of the fifth input information is less than a threshold. The expected check result of the fifth input information is obtained after a multiplication operation and an addition operation are performed on the fifth input information in the $GF(2^m)$ based on a second kernel matrix. The fifth input information is training information.

In the foregoing manner, the encoding neural network including a plurality of neural network units corresponding to different kernel matrices is implemented.

In a possible implementation, a step of obtaining the initial encoding neural network includes: obtaining an encoding network diagram, where the encoding network diagram includes at least one encoding butterfly diagram, and the encoding butterfly diagram is used to indicate a check relationship between input information of the encoding butterfly diagram and output information of the encoding butterfly diagram; matching the first neural network unit with the at least one encoding butterfly diagram; and replacing a successfully matched encoding butterfly diagram with the first neural network unit, to obtain the initial encoding neural network.

In the foregoing manner, the encoding neural network including small neural network units is implemented, so that generalization can be implemented to entire codeword space by using a small learning sample.

According to a second aspect, an embodiment of this application provides a decoding method. The method may include: obtaining first input information; and then, decoding the obtained first input information based on a decoding neural network, to obtain and output first output information. The decoding neural network includes a first neuron parameter. The first neuron parameter is used to indicate a mapping relationship between the first input information and the first output information. The decoding neural network is obtained after an initial decoding neural network consisting of a first neural network unit is trained. The initial decoding neural network includes a second neuron parameter that is used to indicate a mapping relationship between second input information input to the initial decoding neural network and second output information output by the initial decoding neural network. In addition, after the initial decoding neural network is trained, the second neuron parameter is updated to the first neuron parameter. The second neuron parameter consists of a third neuron parameter included in the first neural network unit. The third neuron parameter is used to indicate a mapping relationship between third input information input to the first neural network unit and third output information output by the first neural network unit. An error between the third output information and an expected check result of the third input information is less than a threshold. The expected check result of the third input information is obtained after a multiplication operation and an addition operation are performed on the third input information in a $GF(2^m)$ based on a first kernel matrix. The first input information is to-be-decoded information, and the second input information and the third input information are training information.

In a possible implementation, a step of obtaining the first neural network unit may further include: constructing a first initial neural network unit, and setting a first initial neuron parameter, where the first initial neuron parameter is used to indicate a mapping relationship between fourth input information input to a first initial neuron and fourth output information output by the first initial neuron, the first initial neuron parameter includes an initial weight value and an initial bias vector, the first initial neural network unit includes at least one hidden layer, each hidden layer includes Q nodes, Q is an integer greater than or equal to N, and N is a minimum value in a code length of the third input information and a code length of the third output information; training the first initial neural network unit based on the first initial neuron parameter until an error between the fourth output information and an expected check result of the fourth input information is less than a threshold, where the expected check result of the fourth input information is obtained after a multiplication operation and an addition operation are performed on the fourth input information in the $GF(2^m)$ based on the first kernel matrix; and when the first initial neural network unit is trained, updating the first initial neuron parameter to obtain the third neuron parameter, where the fourth input information is training information.

In a possible implementation, the first kernel matrix is $$\begin{bmatrix} 1 & 0 \\ 1 & 1 \end{bmatrix},$$

or the first kernel matrix is $$\begin{bmatrix} 1 & 1 & 1 \\ 1 & 0 & 1 \\ 0 & 1 & 1 \end{bmatrix}.$$

In a possible implementation, if the first kernel matrix is $$\begin{bmatrix} 1 & 0 \\ 1 & 1 \end{bmatrix},$$

the expected check result of the third input information is $x_0=y_0 \oplus y_1$ and $x_1=y_1$, where $x_0$ and $x_1$ are the third output information, and $y_0$ and $y_1$ are the third input information; or if the first kernel matrix is $$\begin{bmatrix} 1 & 1 & 1 \\ 1 & 0 & 1 \\ 0 & 1 & 1 \end{bmatrix},$$

the expected check result of the third input information is $x_0=y_0 \oplus y_1$, $x_1=y_0 \oplus y_2$, and $x_2=y_0 \oplus y_1 \oplus y_2$, where $x_0$, $x_1$, and $x_2$ are the third output information, and $y_0$, $y_1$, and $y_2$ are the third input information.

In a possible implementation, the initial decoding neural network consists of the first neural network unit and a second neural network unit. The second neural network unit includes a fourth neuron parameter. The second neural network unit is obtained after the first initial neural network unit is trained. The first initial neuron parameter is updated after the first initial neural network unit is trained, to obtain the fourth neuron parameter. The fourth neuron parameter is different from the third neuron parameter.

In a possible implementation, the initial decoding neural network consists of the first neural network unit and a third neural network unit. The third neural network unit includes a fifth neuron parameter. The fifth neuron parameter is used to indicate a mapping relationship between fifth input information input to the third neural network unit and fifth output information output by the third neural network unit. An error between the fifth output information and an expected check result of the fifth input information is less than a threshold. The expected check result of the fifth input information is obtained after a multiplication operation and an addition operation are performed on the fifth input information in the $GF(2^m)$ based on a second kernel matrix. The fifth input information is training information.

In a possible implementation, a step of obtaining the initial decoding neural network includes: obtaining a decoding network diagram, where the decoding network diagram includes at least one decoding butterfly diagram, and the decoding butterfly diagram is used to indicate a check relationship between input information of the decoding butterfly diagram and output information of the decoding butterfly diagram; matching the first neural network unit with the at least one decoding butterfly diagram; and replacing a successfully matched decoding butterfly diagram with the first neural network unit, to obtain the initial decoding neural network.

According to a third aspect, an embodiment of this application provides an encoding/a decoding method. The method may include: encoding and/or decoding first input information based on an encoding/a decoding neural network. The encoding/decoding neural network includes the encoding neural network according to the method in the first aspect or any possible implementation of the first aspect and the decoding neural network according to the method in the second aspect or any possible implementation of the second aspect.

In the foregoing manner, the encoding/decoding method with relatively low learning complexity and relatively low learning difficulty is implemented.

In a possible implementation, a neuron parameter in the encoding neural network is different from a neuron parameter in the decoding neural network; or a neuron parameter in the encoding neural network is the same as a neuron parameter in the decoding neural network.

In the foregoing manner, it is implemented that the encoding/decoding neural network may include the encoding neural network and the decoding neural network that have the same neuron parameter, or include the encoding neural network and the decoding neural network that have different neuron parameters.

According to a fourth aspect, an embodiment of this application provides an encoding apparatus. The apparatus may include: an obtaining module, configured to obtain first input information; and an encoding module, configured to: encode the obtained first input information based on an encoding neural network, to obtain and output first output information. The encoding neural network includes a first neuron parameter. The first neuron parameter may be used to indicate a mapping relationship between the first input information and the first output information. The encoding neural network is obtained after an initial encoding neural network consisting of a first neural network unit is trained. The initial encoding neural network includes a second neuron parameter that is used to indicate a mapping relationship between second input information input to the initial encoding neural network and second output information output by the initial encoding neural network. In addition, after the initial encoding neural network is trained, the second neuron parameter is updated to the first neuron parameter. The second neuron parameter consists of a third neuron parameter included in the first neural network unit. The third neuron parameter is used to indicate a mapping relationship between third input information input to the first neural network unit and third output information output by the first neural network unit. An error between the third output information and an expected check result of the third input information is less than a threshold. The expected check result of the third input information is obtained after a multiplication operation and an addition operation are performed on the third input information in a Galois field $GF(2^m)$ based on a first kernel matrix. The first input information is to-be-encoded information, and the second input information and the third input information are training information.

In a possible implementation, the encoding module is further configured to: construct a first initial neural network unit, and set a first initial neuron parameter, where the first initial neuron parameter is used to indicate a mapping relationship between fourth input information input to a first initial neuron and fourth output information output by the first initial neuron, the first initial neuron parameter includes an initial weight value and an initial bias vector, the first initial neural network unit includes at least one hidden layer, each hidden layer includes Q nodes, Q is an integer greater than or equal to N, and N is a minimum value in a code length of the third input information and a code length of the third output information; train the first initial neural network unit based on the first initial neuron parameter until an error between the fourth output information and an expected check result of the fourth input information is less than a threshold, where the expected check result of the fourth input information is obtained after a multiplication operation and an addition operation are performed on the fourth input information in the $GF(2^m)$ based on the first kernel matrix; and when the first initial neural network unit is trained, update the first initial neuron parameter to obtain the third neuron parameter, where the fourth input information is training information, and the fourth input information is the same as or different from the third input information.

In a possible implementation, the first kernel matrix is $$\begin{bmatrix} 1 & 0 \\ 1 & 1 \end{bmatrix},$$

or the first kernel matrix is $$\begin{bmatrix} 1 & 1 & 1 \\ 1 & 0 & 1 \\ 0 & 1 & 1 \end{bmatrix}.$$

In a possible implementation, if the first kernel matrix is $$\begin{bmatrix} 1 & 0 \\ 1 & 1 \end{bmatrix},$$

the expected check result of the third input information is $x_0=u_0 \oplus u_1$ and $x_1=u_1$, where $x_0$ and $x_1$ are the third output information, and $u_0$ and $u_1$ are the third input information; or if the first kernel matrix is $$\begin{bmatrix} 1 & 1 & 1 \\ 1 & 0 & 1 \\ 0 & 1 & 1 \end{bmatrix},$$

the expected check result of the third input information is $x_0=u_0 \oplus u_1$, $x_1=u_0 \oplus u_2$, and $x_2=u_0 \oplus u_1 \oplus u_2$, where $x_0$, $x_1$, and $x_2$ are the third output information, and $u_0$, $u_1$, and $u_2$ are the third input information.

In a possible implementation, the initial encoding neural network consists of the first neural network unit and a second neural network unit. The second neural network unit includes a fourth neuron parameter. The second neural network unit is obtained after the first initial neural network unit is trained. The first initial neuron parameter is updated after the first initial neural network unit is trained, to obtain the fourth neuron parameter. The fourth neuron parameter is different from the third neuron parameter.

In a possible implementation, the initial encoding neural network consists of the first neural network unit and a third neural network unit. The third neural network unit includes a fifth neuron parameter. The fifth neuron parameter is used to indicate a mapping relationship between fifth input information input to the third neural network unit and fifth output information output by the third neural network unit. An error between the fifth output information and an expected check result of the fifth input information is less than a threshold. The expected check result of the fifth input information is obtained after a multiplication operation and an addition operation are performed on the fifth input information in the $GF(2^m)$ based on a second kernel matrix. The fifth input information is training information.

In a possible implementation, the encoding module is further configured to: obtain an encoding network diagram, where the encoding network diagram includes at least one encoding butterfly diagram, and the encoding butterfly diagram is used to indicate a check relationship between input information of the encoding butterfly diagram and output information of the encoding butterfly diagram; match the first neural network unit with the at least one encoding butterfly diagram; and replace a successfully matched encoding butterfly diagram with the first neural network unit, to obtain the initial encoding neural network.

According to a fifth aspect, an embodiment of this application provides a decoding apparatus. The apparatus may include: an obtaining module, configured to obtain first input information; and a decoding module, configured to: decode the obtained first input information based on a decoding neural network, to obtain and output first output information. The decoding neural network includes a first neuron parameter. The first neuron parameter is used to indicate a mapping relationship between the first input information and the first output information. The decoding neural network is obtained after an initial decoding neural network consisting of a first neural network unit is trained. The initial decoding neural network includes a second neuron parameter that is used to indicate a mapping relationship between second input information input to the initial decoding neural network and second output information output by the initial decoding neural network. In addition, after the initial decoding neural network is trained, the second neuron parameter is updated to the first neuron parameter. The second neuron parameter consists of a third neuron parameter included in the first neural network unit. The third neuron parameter is used to indicate a mapping relationship between third input information input to the first neural network unit and third output information output by the first neural network unit. An error between the third output information and an expected check result of the third input information is less than a threshold. The expected check result of the third input information is obtained after a multiplication operation and an addition operation are performed on the third input information in a Galois field $GF(2^m)$ based on a first kernel matrix. The first input information is to-be-decoded information, and the second input information and the third input information are training information.

In a possible implementation, the decoding module is further configured to: construct a first initial neural network unit, and set a first initial neuron parameter, where the first initial neuron parameter is used to indicate a mapping relationship between fourth input information input to a first initial neuron and fourth output information output by the first initial neuron, the first initial neuron parameter includes an initial weight value and an initial bias vector, the first initial neural network unit includes at least one hidden layer, each hidden layer includes Q nodes, Q is an integer greater than or equal to N, and N is a minimum value in a code length of the third input information and a code length of the third output information; train the first initial neural network unit based on the first initial neuron parameter until an error between the fourth output information and an expected check result of the fourth input information is less than a threshold, where the expected check result of the fourth input information is obtained after a multiplication operation and an addition operation are performed on the fourth input information in the $GF(2^m)$ based on the first kernel matrix; and when the first initial neural network unit is trained, update the first initial neuron parameter to obtain the third neuron parameter, where the fourth input information is training information, and the fourth input information is the same as or different from the third input information.

In a possible implementation, the first kernel matrix is $$\begin{bmatrix} 1 & 0 \\ 1 & 1 \end{bmatrix},$$

or the first kernel matrix is $$\begin{bmatrix} 1 & 1 & 1 \\ 1 & 0 & 1 \\ 0 & 1 & 1 \end{bmatrix}.$$

In a possible implementation, if the first kernel matrix is $$\begin{bmatrix} 1 & 0 \\ 1 & 1 \end{bmatrix},$$

the expected check result of the third input information is $x_0=y_0 \oplus y_1$ and $x_1=y_1$, where $x_0$ and $x_1$ are the third output information, and $y_0$ and $y_1$ are the third input information; or if the first kernel matrix is $$\begin{bmatrix} 1 & 1 & 1 \\ 1 & 0 & 1 \\ 0 & 1 & 1 \end{bmatrix},$$

the expected check result of the third input information is $x_0=y_0 \oplus y_1$, $x_1=y_0 \oplus y_2$, and $x_2=y_0 \oplus y_1 \oplus y_2$, where $x_0$, $x_1$, and $x_2$ are the third output information, and $y_0$, $y_1$, and $y_2$ are the third input information.

In a possible implementation, the initial decoding neural network consists of the first neural network unit and a second neural network unit. The second neural network unit includes a fourth neuron parameter. The second neural network unit is obtained after the first initial neural network unit is trained. The first initial neuron parameter is updated after the first initial neural network unit is trained, to obtain the fourth neuron parameter. The fourth neuron parameter is different from the third neuron parameter.

In a possible implementation, the initial decoding neural network consists of the first neural network unit and a third neural network unit. The third neural network unit includes a fifth neuron parameter. The fifth neuron parameter is used to indicate a mapping relationship between fifth input information input to the third neural network unit and fifth output information output by the third neural network unit. An error between the fifth output information and an expected check result of the fifth input information is less than a threshold. The expected check result of the fifth input information is obtained after a multiplication operation and an addition operation are performed on the fifth input information in the $GF(2^m)$ based on a second kernel matrix. The fifth input information is training information.

In a possible implementation, the decoding module is further configured to: obtain a decoding network diagram, where the decoding network diagram includes at least one decoding butterfly diagram, and the decoding butterfly diagram is used to indicate a check relationship between input information of the decoding butterfly diagram and output information of the decoding butterfly diagram; match the first neural network unit with the at least one decoding butterfly diagram; and replace a successfully matched decoding butterfly diagram with the first neural network unit, to obtain the initial decoding neural network.

According to a sixth aspect, an embodiment of this application provides an encoding/a decoding system. The system is used for encoding and/or decoding first input information based on an encoding/a decoding neural network. The system is used for the encoding neural network according to the apparatus in the fourth aspect or any possible implementation of the fourth aspect and the decoding neural network according to the apparatus in the fifth aspect or any possible implementation of the fifth aspect.

In a possible implementation, a neuron parameter in the encoding neural network is different from a neuron parameter in the decoding neural network; or a neuron parameter in the encoding neural network is the same as a neuron parameter in the decoding neural network.

According to a seventh aspect, an embodiment of this application provides a computer readable storage medium. The computer readable storage medium stores a computer program. The computer program includes at least one segment of code. The at least one segment of code may be executed by an apparatus, to control the apparatus to perform the method in the first aspect.

According to an eighth aspect, an embodiment of this application provides a computer readable storage medium. The computer readable storage medium stores a computer program. The computer program includes at least one segment of code. The at least one segment of code may be executed by an apparatus, to control the apparatus to perform the method in the second aspect.

According to a ninth aspect, an embodiment of this application provides a computer readable storage medium. The computer readable storage medium stores a computer program. The computer program includes at least one segment of code. The at least one segment of code may be executed by an apparatus, to control the apparatus to perform the method in the third aspect.

According to a tenth aspect, an embodiment of this application provides a computer program. When the computer program is executed by an apparatus, the apparatus is configured to perform the method in the first aspect.

According to an eleventh aspect, an embodiment of this application provides a computer program. When the computer program is executed by an apparatus, the apparatus is configured to perform the method in the second aspect.

According to an twelfth aspect, an embodiment of this application provides a computer program. When the computer program is executed by an apparatus, the apparatus is configured to perform the method in the third aspect.

According to a thirteenth aspect, an embodiment of this application provides a chip. The chip includes a processing circuit and a transceiver pin. The transceiver pin and the processor communicate with each other by using an internal connection path. The processor performs the method in the first aspect or any possible implementation of the first aspect, to control a receive pin to receive a signal and control a transmit pin to send a signal.

According to a fourteenth aspect, an embodiment of this application provides a chip. The chip includes a processing circuit and a transceiver pin. The transceiver pin and the processor communicate with each other by using an internal connection path. The processor performs the method in the second aspect or any possible implementation of the second aspect, to control a receive pin to receive a signal and control a transmit pin to send a signal.

According to a fifteenth aspect, an embodiment of this application provides a chip. The chip includes a processing circuit and a transceiver pin. The transceiver pin and the processor communicate with each other by using an internal connection path. The processor performs the method in the third aspect or any possible implementation of the third aspect, to control a receive pin to receive a signal and control a transmit pin to send a signal.

According to a sixteenth aspect, an embodiment of this application provides an encoding apparatus. The apparatus includes: a memory, configured to store an instruction or data; and at least one processor in a communication connection to the memory. The processor may be configured to support the encoding apparatus in performing the method in the first aspect or any possible implementation of the first aspect when the encoding apparatus runs the instruction.

According to a seventeenth aspect, an embodiment of this application provides a decoding apparatus. The apparatus includes: a memory, configured to store an instruction or data; and at least one processor in a communication connection to the memory. The processor may be configured to support a decoding apparatus in performing the method in the second aspect or any possible implementation of the second aspect when the decoding apparatus runs the instruction.

According to an eighteenth aspect, an embodiment of this application provides an encoding/a decoding apparatus. The apparatus includes: a memory, configured to store an instruction or data; and at least one processor in a communication connection to the memory. The processor may be configured to support an encoding/decoding apparatus in performing the method in the third aspect or any possible implementation of the third aspect when the encoding/decoding apparatus runs the instruction.

According to a nineteenth aspect, an embodiment of this application provides an encoding/decoding system. The system includes the encoding apparatus and the decoding apparatus in the fourth aspect and the fifth aspect.

BRIEF DESCRIPTION OF DRAWINGS

To describe the technical solutions in the embodiments of this application more clearly, the following briefly describes the accompanying drawings in the embodiments of this application. It is clear that the accompanying drawings in the following description show merely some embodiments of this application, and a person of ordinary skill in the art may derive other drawings from these accompanying drawings without creative efforts.

DESCRIPTION OF EMBODIMENTS

The following clearly describes the technical solutions in the embodiments of this application with reference to the accompanying drawings in the embodiments of this application. It is clear that the described embodiments are some but not all of the embodiments of this application. All other embodiments obtained by a person of ordinary skill in the art based on the embodiments of this application without creative efforts shall fall within the protection scope of this application.

The term “and/or” in this specification describes only an association relationship for describing associated objects and represents that three relationships may exist. For example, A and/or B may represent the following three cases: Only A exists, both A and B exist, and only B exists.

In the specification and claims in the embodiments of this application, the terms “first”, “second”, and so on are intended to distinguish between different objects but do not indicate a particular order of the objects. For example, a first target object, a second target object, and the like are used to distinguish between different target objects, but are not used to describe a particular order of the target objects.

In the embodiments of this application, a word such as “for example” is used to represent giving an example, an illustration, or a description. Any embodiment or design scheme described as “exemplary” or “for example” in the embodiments of this application should not be explained as being more preferred or having more advantages than another embodiment or design scheme. Exactly, use of the word “exemplary”, “for example”, or the like is intended to present a relative concept in a specific manner.

In the description of the embodiment of this application, unless otherwise stated, “a plurality of” means two or more than two. For example, a plurality of processing units indicate two or more processing units, and a plurality of systems indicate two or more systems.

Figure 1:
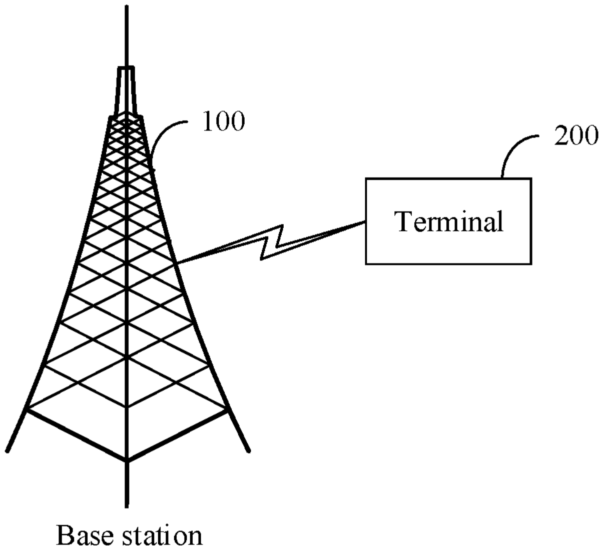
FIG. 1 is a schematic diagram of a communications system according to an embodiment of this application.

Before the technical solutions in the embodiments of this application are described, a communications system in the embodiments of this application is first described with reference to the accompanying drawings. FIG. 1 is a schematic diagram of a communications system according to an embodiment of this application. The communications system includes a base station 100 and a terminal 200. In a specific implementation process of this embodiment of this application, the terminal 200 may be a device such as a computer, a smartphone, a telephone set, a cable television set-top box, or a digital subscriber line router. It should be noted that in actual application, there may be one or more base stations and one or more terminals. A quantity of base stations and a quantity of terminals in the communications system shown in FIG. 1 are merely an adaptation example. This is not limited in this application.

The communications system may be used to support a 4th generation (4G) access technology, such as a long term evolution (LTE) access technology. Alternatively, the communications system may support a 5th generation (5G) access technology, such as a new radio (NR) access technology. Alternatively, the communications system may be used to support a 3rd generation (3G) access technology, such as a universal mobile telecommunications system (UMTS) access technology. Alternatively, the communications system may be used to support a 2nd generation (2G) access technology, such as a global system for mobile communications (GSM) access technology. Alternatively, the communications system may be further used to support communications systems with a plurality of wireless technologies, for example, support an LTE technology and an NR technology. In addition, the communications system may be alternatively used in a narrowband Internet of things (NB-IoT) system, an enhanced data rates for GSM evolution (EDGE) system, a wideband code division multiple access (WCDMA) system, a code division multiple access 2000 (CDMA2000) system, a time division-synchronous code division multiple access (TD-SCDMA) system, a long term evolution (LTE) system, and a future communication technology.

In addition, the base station 100 in FIG. 1 may be used to support terminal access, for example, may be a base transceiver station (BTS) and a base station controller (BSC) in a 2G access technology communications system; a NodeB and a radio network controller (RNC) in a 3G access technology communications system; an evolved NodeB (eNB) in a 4G access technology communications system; a next generation NodeB (gNB), a transmission reception point (TRP), a relay node, or an access point (AP) in a 5G access technology communications system; or the like. For ease of description, in all the embodiments of this application, all the foregoing apparatuses that provide a wireless communication function for the terminal are referred to as a network device or a base station.

The terminal 200 in FIG. 1 may be a device that provides voice or data connectivity for a user, for example, may also be referred to as a mobile station, a subscriber unit, a station, or terminal equipment (TE). The terminal 200 may be a cellular phone, a personal digital assistant (PDA), a wireless modem, a handheld device, a laptop computer, a cordless phone, a wireless local loop (WLL) station, a tablet computer (pad), or the like. With development of the wireless communication technology, a device that can access a wireless communications network, can communicate with a network side in the communications system, or can communicate with another object by using the communications network may be the terminal in this embodiment of this application, for example, a terminal and a vehicle in intelligent transportation, a household device in a smart household, an electricity meter reading instrument in a smart grid, a voltage monitoring instrument, an environment monitoring instrument, a video surveillance instrument in an intelligent security network, or a cash register. In this embodiment of this application, the terminal 200 may communicate with a base station, for example, the base station 100 in FIG. 1. Communication may also be performed between a plurality of terminals. The terminal 200 may be static or mobile.

Figure 2A:
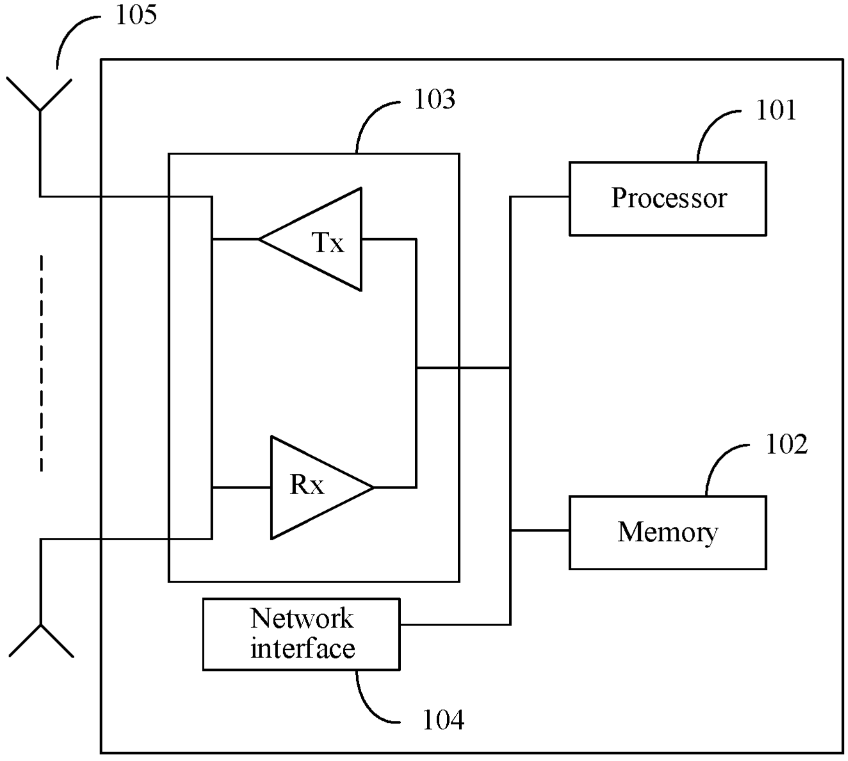
FIG. 2*a* is a schematic structural diagram of a base station according to an embodiment of this application.

FIG. 2*a* is a schematic structural diagram of a base station.

In FIG. 2*a*, the base station 100 includes at least one processor 101, at least one memory 102, at least one transceiver 103, at least one network interface 104, and one or more antennas 105. The processor 101, the memory 102, the transceiver 103, and the network interface 104 are connected, for example, by using a bus. The antenna 105 is connected to the transceiver 103. The network interface 104 is used to enable the base station to be connected to another communications device by using a communication link. In this embodiment of this application, the connection may include various types of interfaces, transmission lines, buses, or the like. This is not limited in this embodiment.

The processor in this embodiment of this application, for example, the processor 101, may include at least one of the following types: a general purpose central processing unit (CPU), a digital signal processor (DSP), a microprocessor, an application-specific integrated circuit (ASIC), a microcontroller unit (MCU), a field programmable gate array (FPGA), or an integrated circuit configured to implement a logical operation. For example, the processor 101 may be a single-core (single-CPU) processor, or may be a multi-core (multi-CPU) processor. The at least one processor 101 may be integrated into one chip or located on a plurality of different chips.

The memory in this embodiment of this application, for example, the memory 102, may include at least one of the following types: a read-only memory (ROM) or another type of static storage device that can store static information and instructions, a random access memory (RAM) or another type of dynamic storage device that can store information and instructions, or may be an electrically erasable programmable read-only memory (EEPROM). In some scenarios, the memory may alternatively be a compact disc read-only memory (CD-ROM) or other compact disc storage, optical disc storage (including a compact disc, a laser disc, an optical disc, a digital versatile disc, a Blu-ray disc, and the like), a disk storage medium or another magnetic storage device, or any other medium that can be used to carry or store expected program code having an instruction or a data structure form and that can be accessed by a computer. However, this is not limited herein.

The memory 102 may exist alone, and be connected to the processor 101. Optionally, the memory 102 may be integrated with the processor 101, for example, integrated into one chip. The memory 102 can store program code for executing the technical solutions in this embodiment of this application, and is controlled by the processor 101 to execute the program code. The executed computer program code may also be considered as a driver of the processor 101. For example, the processor 101 is configured to execute the computer program code stored in the memory 102, to implement the technical solutions in this embodiment of this application.

The transceiver 103 may be configured to support receiving or sending of a radio frequency signal between an access network device and a terminal. The transceiver 103 may be connected to the antenna 105. The transceiver 103 includes a transmitter Tx and a receiver Rx. Specifically, one or more antennas 105 may receive a radio frequency signal. The receiver Rx of the transceiver 103 is configured to: receive the radio frequency signal from the antenna, convert the radio frequency signal into a digital baseband signal or a digital intermediate frequency signal, and provide the digital baseband signal or the digital intermediate frequency signal for the processor 101, so that the processor 101 further processes the digital baseband signal or the digital intermediate frequency signal, for example, performs demodulating processing and decoding processing. In addition, the transmitter Tx in the transceiver 103 is further configured to: receive the modulated digital baseband signal or the modulated digital intermediate frequency signal from the processor 101, convert the modulated digital baseband signal or the modulated digital intermediate frequency signal into a radio frequency signal, and send the radio frequency signal by using the one or more antennas 105. Specifically, the receiver Rx may selectively perform one level or multi-level down-conversion frequency mixing processing and analog-to-digital conversion processing on the radio frequency signal to obtain the digital baseband signal or the digital intermediate frequency signal. A sequence of the down-conversion frequency mixing processing and the analog-to-digital conversion processing is adjustable. The transmitter Tx may selectively perform one level or multi-level up-conversion frequency mixing processing and digital-to-analog conversion processing on the modulated digital baseband signal or the modulated digital intermediate frequency signal to obtain the radio frequency signal. A sequence of the up-conversion frequency mixing processing and the digital-to-analog conversion processing is adjustable. The digital baseband signal and the digital intermediate frequency signal may be collectively referred to as a digital signal.

Figure 2B:
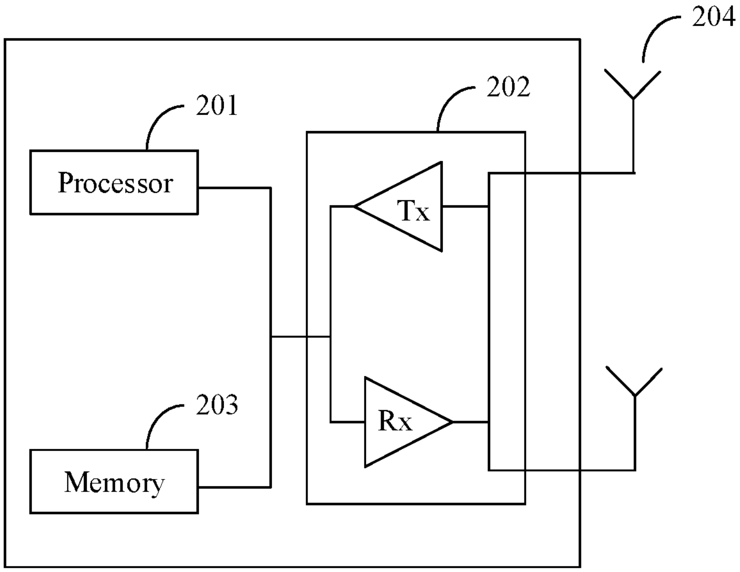
FIG. 2*b* is a schematic structural diagram of a terminal according to an embodiment of this application.

FIG. 2*b* is a schematic structural diagram of a terminal. In FIG. 2*b*, The terminal 200 includes at least one processor 201, at least one transceiver 202, and at least one memory 203. The processor 201, the memory 203, and the transceiver 202 are connected. Optionally, the terminal 200 may further include one or more antennas 204. The antenna 204 is connected to the transceiver 202.

For the transceiver 202, the memory 203, and the antenna 204, refer to related descriptions in FIG. 2*a* to implement similar functions.

The processor 201 may be a baseband processor, or may be a CPU. The baseband processor and the CPU may be integrated together or be separated.

The processor 201 may be configured to implement various functions for the terminal 200, for example, process a communications protocol and communication data, control the entire terminal 200, execute a software program, and process data of the software program. Alternatively, the processor 201 is configured to implement one or more of the foregoing functions.

Figure 3:
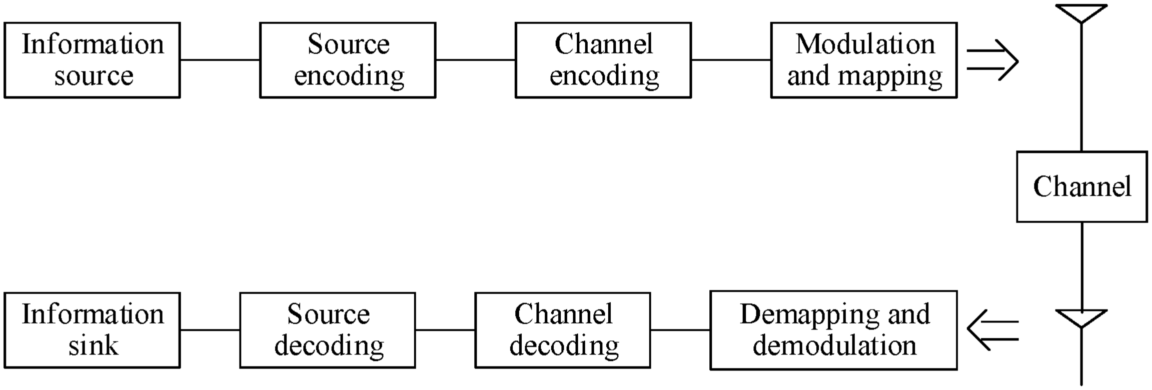
FIG. 3 is a schematic flowchart of wireless communication according to an embodiment of this application.

In the foregoing communications system, when the terminal communicates with the base station, the terminal and the base station each are a transmit end and a receive end to each other. To be specific, when the terminal sends a signal to the base station, the terminal serves as the transmit end, and the base station serves as the receive end. Otherwise, when the base station sends a signal to the terminal, the base station serves as the transmit end, and the terminal serves as the receive end. Specifically, in a wireless communication process, a basic procedure is shown in FIG. 3. In FIG. 3, At the transmit end, an information source is transmitted after source encoding, channel encoding, and modulation and mapping. At the receive end, an information sink is output after demapping and demodulation, channel decoding, and source decoding.

It should be noted that, when the terminal serves as the transmit end, an encoding process (steps such as source encoding, channel encoding, and modulation and mapping) in FIG. 3 is executed by the terminal; or when the terminal serves as the receive end, a decoding process (steps such as demapping and demodulation, channel decoding, and source decoding) in FIG. 3 is executed by the terminal. The same cases are also applicable to the base station.

A current channel encoding/decoding manner includes but is not limited to Hamming code and polar code.

In a conventional technology, an encoding/a decoding learning process is mainly to learn a sample of entire codeword space. However, for an encoding/decoding manner with a relatively long code length, for example, polar code, for example, when an information bit length K=32, there are $2^{32}$ codewords. Therefore, encoding/decoding learning cannot be completed in the conventional technology due to a sharp increase in difficulty and complexity.

In conclusion, this embodiment of this application provides an encoding/a decoding method for implementing a small-range sampling in the codeword space to implement generalization to the entire codeword space. In the method, an encoding/a decoding neural network consists of a neural network unit generated through encoding/decoding, and then to-be-encoded information is encoded and/or decoded based on the encoding/decoding neural network.

With reference to the foregoing schematic diagram of the communications system shown in FIG. 1, the following describes specific implementation solutions of this application.

Scenario 1

Figure 4:
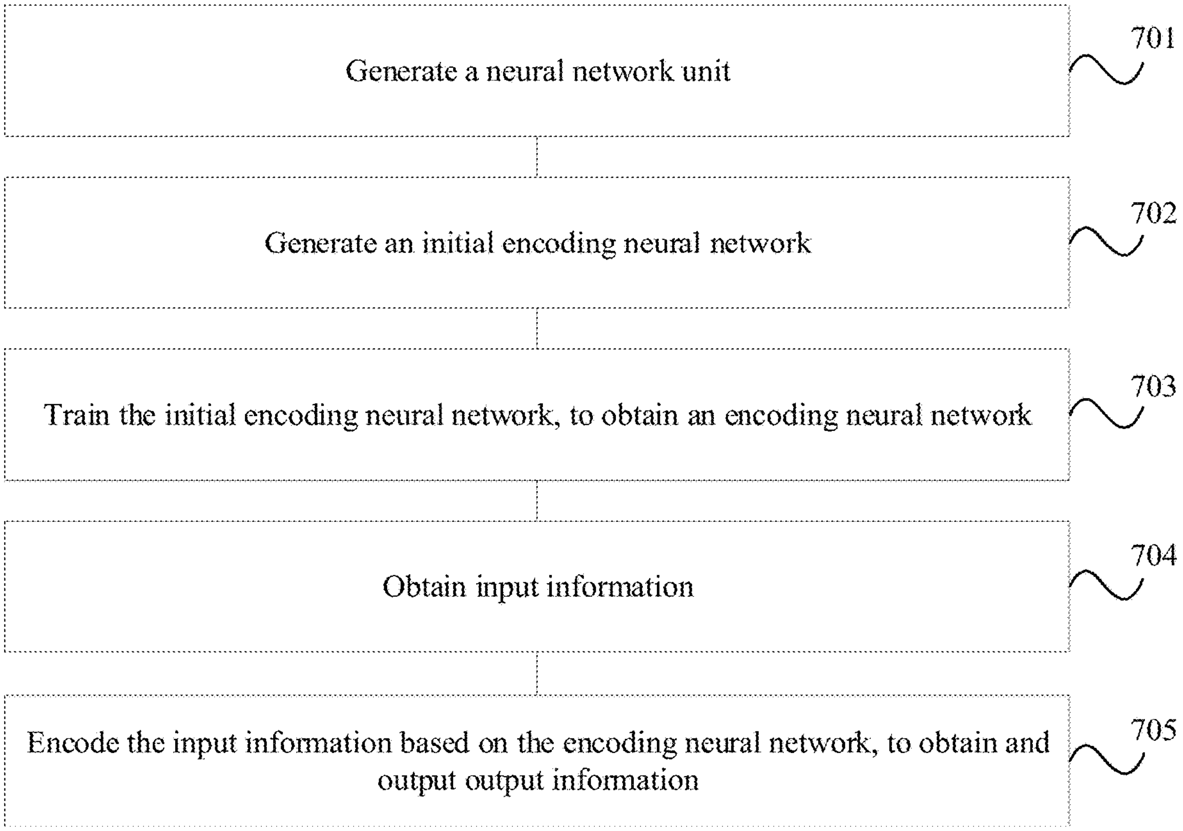
FIG. 4 is a schematic flowchart of an encoding method according to an embodiment of this application.

With reference to FIG. 1, FIG. 4 is a schematic flowchart of an encoding method according to an embodiment of this application. In FIG. 4, Step 701: Generate a neural network unit.

Specifically, in this embodiment of this application, an encoding apparatus may generate an initial neural network unit based on a kernel matrix, and then the encoding apparatus trains the initial neural network unit, so that an output value of the initial neural network unit is close to an expected optimization target. In this case, the trained initial neural network unit is the neural network unit. After the training, an initial neuron parameter included in the initial neural network unit is updated to a neuron parameter included in the neural network unit. In addition, that the output value is close to the expected optimization target is that an error between output information output by the initial neural network unit and an expected check result corresponding to input information input to the initial neural network unit is less than a threshold. In this embodiment of this application, the expected check result of the input information is obtained after a multiplication operation and an addition operation are performed on the input information in a Galois field GF(2) based on a kernel matrix corresponding to the initial neural network unit.

Optionally, in an embodiment, the error between the output information and the expected check result of the input information may be a difference between the output information and the expected check result.

Optionally, in another embodiment, the error between the output information and the expected check result of the input information may be a mean square error between the output information and the expected check result.

An operator may set a manner of obtaining the error between the output information and the expected check result according to an actual requirement. This is not limited in this application.

In addition, a threshold corresponding to the error between the output information and the expected check result may also be correspondingly set based on different error calculation manners.

Figure 5:
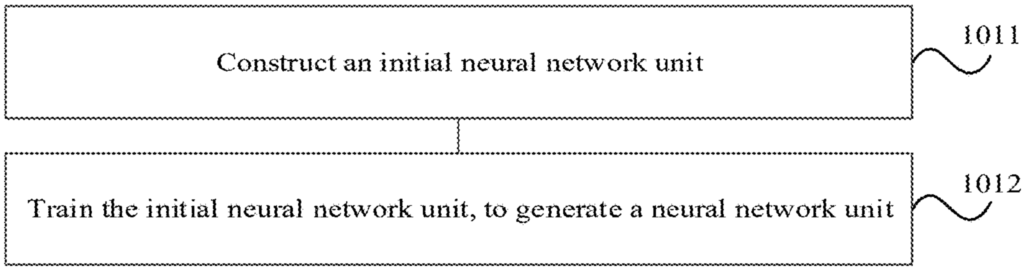
FIG. 5 is a schematic flowchart of an encoding method according to an embodiment of this application.

The following describes in detail a method for generating the neural network unit with reference to polar code. FIG. 5 is a schematic flowchart of generating a neural network unit. In FIG. 5, Step 1011: Construct the initial neural network unit.

Specifically, an encoding formula for the polar code may be indicated by using the following Formula (1):

$$x = uG \tag{1}$$

Herein, x is the output information, u is the input information, and G is an encoding matrix. For the polar code, G may also be referred to as a generator matrix. In other words, the generator matrix is one of encoding matrices. Both the input information and the output information include at least one piece of bit information.

In the conventional technology, an expression of the generator matrix G of the polar code may be Formula (2) as follows:

$$G = T \otimes T \ \ldots \ldots \ \otimes T = T^{\otimes n} \tag{2}$$

Herein, ⊗ indicates a Kronecker product, $\otimes_n$ indicates a Kronecker power, n indicates that an encoding neural network consisting of G may include one or more neural network units corresponding to the same kernel matrix. A specific implementation is described in detail in the following embodiment.

In this embodiment of this application, when the initial neural network unit is formed, the encoding apparatus may obtain the neural network unit based on the kernel matrix. Specifically, the encoding apparatus obtains, according to Formula (1) and Formula (2), a check equation corresponding to the expected check result of the input information (to be distinguished from input information of another neural network or neural network unit, the input information is referred to as input information 4 below) of the neural network unit.

For example, if $$T_2 = \begin{bmatrix} 1 & 0 \\ 1 & 1 \end{bmatrix},$$

the check equation corresponding to the input information 4 is as follows:

$$x_0 = u_0 \oplus u_1,\ x_1 = u_1 \tag{3}$$

Herein, $x_0$ and $x_1$ are output information 4, and $u_0$ and $u_1$ are the input information 4.

If $$T_3 = \begin{bmatrix} 1 & 1 & 1 \\ 1 & 0 & 1 \\ 0 & 1 & 1 \end{bmatrix},$$

the check equation corresponding to the input information 4 is as follows:

$$x_0 = u_0 \oplus u_1,\ x_1 = u_0 \oplus u_2,\ x_2 = u_0 \oplus u_1 \oplus u_2 \tag{4}$$

Herein, $x_0$, $x_1$, and $x_2$ are output information 4, and $u_0$, $u_1$, and $u_2$ are the input information 4.

It should be noted that a value of T may be obtained through searching a table (for example, a value in Table (1)) or through calculation. For a specific obtaining manner, refer to the conventional technology. Details are not described in this application.

In addition, common T is shown in Table (1).

TABLE 1

| | |
|---|---|
| $T_5$ | $\begin{bmatrix} 1 & 0 & 0 & 0 & 0 \\ 1 & 1 & 0 & 0 & 0 \\ 1 & 0 & 1 & 0 & 0 \\ 1 & 0 & 0 & 1 & 0 \\ 1 & 1 & 1 & 0 & 1 \end{bmatrix}$ |
| $T_6$ | $\begin{bmatrix} 1 & 0 & 0 & 0 & 0 & 0 \\ 1 & 1 & 0 & 0 & 0 & 0 \\ 1 & 0 & 1 & 0 & 0 & 0 \\ 1 & 0 & 0 & 1 & 0 & 0 \\ 1 & 1 & 1 & 0 & 1 & 0 \\ 1 & 1 & 0 & 1 & 0 & 1 \end{bmatrix}$ |
| $T_7$ | $\begin{bmatrix} 1 & 0 & 0 & 0 & 0 & 0 & 0 \\ 1 & 1 & 0 & 0 & 0 & 0 & 0 \\ 1 & 0 & 1 & 0 & 0 & 0 & 0 \\ 1 & 0 & 0 & 1 & 0 & 0 & 0 \\ 1 & 1 & 1 & 0 & 1 & 0 & 0 \\ 1 & 1 & 0 & 1 & 0 & 1 & 0 \\ 1 & 0 & 1 & 1 & 0 & 0 & 1 \end{bmatrix}$ |

TABLE 1-continued

| | |
|---|---|
| $T_8$ | $\begin{bmatrix} 1&0&0&0&0&0&0&0 \\ 1&1&0&0&0&0&0&0 \\ 1&0&1&0&0&0&0&0 \\ 1&0&0&1&0&0&0&0 \\ 1&1&1&0&1&0&0&0 \\ 1&1&0&1&0&1&0&0 \\ 1&0&1&1&0&0&1&0 \\ 1&1&1&1&1&1&1&1 \end{bmatrix}$ |
| $T_9$ | $\begin{bmatrix} 1&0&0&0&0&0&0&0&0 \\ 1&1&0&0&0&0&0&0&0 \\ 1&0&1&0&0&0&0&0&0 \\ 1&0&0&1&0&0&0&0&0 \\ 1&0&0&0&1&0&0&0&0 \\ 1&1&0&1&0&1&0&0&0 \\ 1&0&1&1&0&0&1&0&0 \\ 1&0&1&1&1&1&0&1&0 \\ 0&1&1&1&0&0&1&1&1 \end{bmatrix}$ |
| $T_{10}$ | $\begin{bmatrix} 1&0&0&0&0&0&0&0&0&0 \\ 1&1&0&0&0&0&0&0&0&0 \\ 1&0&1&0&0&0&0&0&0&0 \\ 1&0&0&1&0&0&0&0&0&0 \\ 1&1&1&0&1&0&0&0&0&0 \\ 0&1&1&1&0&1&0&0&0&0 \\ 1&1&0&0&0&1&1&0&0&0 \\ 1&1&0&1&0&0&0&1&0&0 \\ 1&1&0&0&1&1&0&1&1&0 \\ 1&1&1&1&0&1&1&1&0&1 \end{bmatrix}$ |
| $T_{11}$ | $\begin{bmatrix} 1&0&0&0&0&0&0&0&0&0&0 \\ 1&1&0&0&0&0&0&0&0&0&0 \\ 1&0&1&0&0&0&0&0&0&0&0 \\ 1&0&0&1&0&0&0&0&0&0&0 \\ 1&1&0&1&1&0&0&0&0&0&0 \\ 0&1&1&1&0&1&0&0&0&0&0 \\ 1&1&0&0&0&1&1&0&0&0&0 \\ 1&1&0&1&0&0&0&1&0&0&0 \\ 1&0&0&1&1&1&1&0&1&0&0 \\ 1&1&0&0&0&1&0&1&1&1&0 \\ 1&1&1&1&1&0&0&0&1&1&1 \end{bmatrix}$ |
| $T_{12}$ | $\begin{bmatrix} 1&0&0&0&0&0&0&0&0&0&0&0 \\ 1&1&0&0&0&0&0&0&0&0&0&0 \\ 1&0&1&0&0&0&0&0&0&0&0&0 \\ 1&0&0&1&0&0&0&0&0&0&0&0 \\ 1&1&0&1&1&0&0&0&0&0&0&0 \\ 0&1&1&1&0&1&0&0&0&0&0&0 \\ 1&1&0&0&0&1&1&0&0&0&0&0 \\ 1&1&0&1&0&0&0&1&0&0&0&0 \\ 1&0&0&1&1&1&1&0&1&0&0&0 \\ 1&1&0&0&0&1&0&1&1&1&0&0 \\ 1&1&1&1&1&0&0&0&1&1&1&0 \\ 1&1&1&1&0&1&1&1&0&0&0&1 \end{bmatrix}$ |
| $T_{13}$ | $\begin{bmatrix} 1&0&0&0&0&0&0&0&0&0&0&0&0 \\ 1&1&0&0&0&0&0&0&0&0&0&0&0 \\ 1&0&1&0&0&0&0&0&0&0&0&0&0 \\ 1&0&0&1&0&0&0&0&0&0&0&0&0 \\ 0&0&1&0&1&0&0&0&0&0&0&0&0 \\ 1&0&1&0&1&1&0&0&0&0&0&0&0 \\ 0&0&1&1&0&1&1&0&0&0&0&0&0 \\ 0&1&1&1&0&0&0&1&0&0&0&0&0 \\ 1&1&1&0&0&0&0&0&1&0&0&0&0 \\ 1&1&0&1&0&0&1&1&0&1&0&0&0 \\ 1&1&1&0&0&1&1&0&0&0&1&0&0 \\ 1&1&1&1&0&0&0&0&1&1&1&1&0 \\ 1&1&1&1&1&1&1&1&1&0&0&0&1 \end{bmatrix}$ |
| $T_{14}$ | $\begin{bmatrix} 1&0&0&0&0&0&0&0&0&0&0&0&0&0 \\ 1&1&0&0&0&0&0&0&0&0&0&0&0&0 \\ 1&0&1&0&0&0&0&0&0&0&0&0&0&0 \\ 0&0&1&1&0&0&0&0&0&0&0&0&0&0 \\ 1&0&1&1&1&0&0&0&0&0&0&0&0&0 \\ 1&1&0&1&0&1&0&0&0&0&0&0&0&0 \\ 0&0&1&1&1&0&1&0&0&0&0&0&0&0 \\ 1&0&0&1&0&0&1&1&0&0&0&0&0&0 \\ 1&0&1&1&0&0&0&0&1&0&0&0&0&0 \\ 1&1&1&0&0&0&0&1&1&1&0&0&0&0 \\ 1&1&0&0&0&1&1&0&1&0&1&0&0&0 \\ 0&1&1&1&0&0&1&1&0&0&0&1&0&0 \\ 1&1&1&1&1&1&0&0&0&0&0&1&1&0 \\ 1&1&1&1&1&1&1&1&1&1&1&0&0&1 \end{bmatrix}$ |
| $T_{15}$ | $\begin{bmatrix} 1&0&0&0&0&0&0&0&0&0&0&0&0&0&0 \\ 1&1&0&0&0&0&0&0&0&0&0&0&0&0&0 \\ 1&0&1&0&0&0&0&0&0&0&0&0&0&0&0 \\ 0&0&1&1&0&0&0&0&0&0&0&0&0&0&0 \\ 1&0&1&1&1&0&0&0&0&0&0&0&0&0&0 \\ 1&1&0&1&0&1&0&0&0&0&0&0&0&0&0 \\ 0&0&1&1&1&0&1&0&0&0&0&0&0&0&0 \\ 1&0&0&1&0&0&1&1&0&0&0&0&0&0&0 \\ 1&0&1&1&0&0&0&0&1&0&0&0&0&0&0 \\ 1&1&1&0&0&0&0&1&1&1&0&0&0&0&0 \\ 1&1&0&0&0&1&1&0&1&0&1&0&0&0&0 \\ 0&1&1&1&0&0&1&1&0&0&0&1&0&0&0 \\ 1&1&1&1&1&1&0&0&0&0&0&1&1&0&0 \\ 1&0&1&1&0&0&1&1&1&0&0&0&1&1&0 \\ 1&1&1&1&1&1&1&1&1&1&1&0&0&0&1 \end{bmatrix}$ |
| $T_{16}$ | $\begin{bmatrix} 1&0&0&0&0&0&0&0&0&0&0&0&0&0&0&0 \\ 1&1&0&0&0&0&0&0&0&0&0&0&0&0&0&0 \\ 1&0&1&0&0&0&0&0&0&0&0&0&0&0&0&0 \\ 1&0&0&1&0&0&0&0&0&0&0&0&0&0&0&0 \\ 1&1&0&1&1&0&0&0&0&0&0&0&0&0&0&0 \\ 1&1&1&0&0&1&0&0&0&0&0&0&0&0&0&0 \\ 0&1&0&0&1&1&1&0&0&0&0&0&0&0&0&0 \\ 1&1&0&1&1&0&1&1&0&0&0&0&0&0&0&0 \\ 0&0&0&1&1&1&0&0&1&0&0&0&0&0&0&0 \\ 1&1&1&1&1&1&1&1&1&1&0&0&0&0&0&0 \\ 1&1&0&1&0&1&1&0&0&0&1&0&0&0&0&0 \\ 1&0&0&1&1&1&0&1&1&0&1&1&0&0&0&0 \\ 0&1&0&0&1&1&1&1&0&1&1&0&1&0&0&0 \\ 1&1&1&0&0&1&0&0&1&1&1&0&0&1&0&0 \\ 1&0&1&0&0&0&0&1&0&1&1&1&1&0&1&0 \\ 1&1&1&1&1&1&1&1&1&1&1&1&1&1&1&1 \end{bmatrix}$ |

Still with reference to FIG. 5, the initial neural network unit includes an input layer, an output layer, and at least one hidden layer. In this embodiment of this application, the initial neural network unit further includes the initial neuron parameter. The parameter is used to indicate a mapping relationship between the input information 4 and the output information 4. The initial neuron parameter may include an initial weight value w and an initial bias vector b. It should be noted that the initial neuron parameter is usually randomly generated.

In addition, the hidden layer in the initial neural network unit includes Q nodes. In this embodiment of this application, Q is greater than or equal to N, and N is a minimum value in a code length of the input information and a code length of the output information. It should be noted that there may be one or more hidden layers. A larger quantity of hidden layers indicates greater complexity of the neural network and a stronger generalization capability of the neural network. Therefore, when the operator sets the initial neural network unit and a quantity of hidden layers of another neural network in this embodiment of this application, the operator may perform setting according to an actual requirement with reference to factors such as a processing capability and a computing capability of the apparatus. This is not limited in this application.

Figure 6:
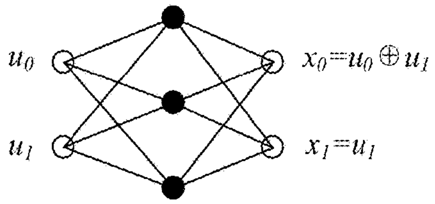
FIG. 6 is a schematic structural diagram of an initial neural network unit according to an embodiment of this application.

In this embodiment, the initial neural network unit constructed based on the polar code in an example is shown in FIG. 6. In FIG. 6, The encoding apparatus constructs the initial neural network unit based on a kernel matrix $T_2$. The expected check result corresponding to the initial neural network unit constructed based on $T_2$ is shown as an output side of the initial neural network unit in FIG. 6. Refer to Formula (3).

Because of particularity of the polar code, in an encoding or a decoding process, the code length of the input information and the code length of the output information are symmetrical, that is, equal. For example, as shown in Formula (3), if the input information is $u_0$ and $u_1$, the output information is $x_0$ and $x_1$, and the code length is N=2.

Therefore, in the polar code, a quantity of nodes at the hidden layer is greater than the code length of the input information and the code length of the output information. In other words, when the code length of the input information and the code length of the output information are 2, the quantity of nodes at the hidden layer is an integer greater than 2. In FIG. 6, the following example is used for detailed description: The initial neural network unit has one hidden layer and the hidden layer has three nodes.

Step 1012: Train the initial neural network unit, to generate the neural network unit.

Specifically, in this embodiment, the encoding apparatus may train the initial neural network unit based on the initial neuron parameter until the error between the output information 4 and the expected check result of the input information 4 is less than the threshold.

The initial neural network unit in FIG. 6 is still used as an example for description.

Specifically, the following example is used: The input information 4 is [0, 1], that is, $u_0$=0 and $u_1$=1. The encoding apparatus performs a multiplication operation and an addition operation on the input information 4 in the GF(2) according to Formula (3), that is, an exclusive OR operation (it should be noted that in this embodiment, m=1, that is, the expected check result in this embodiment is calculated in a binary field based on a binary feature of the input information), to obtain the expected check result [1, 1] corresponding to the input information 4, that is, $x_0$=1, and $x_1$=1.

Then, the encoding apparatus trains the initial neural network unit based on the input information 4, the expected check result of the input information 4, and the initial neuron parameter. A training process is as follows.

(1) Obtain a Loss Function.

Specifically, for neurons at two adjacent layers (that is, nodes at the input layer, the output layer, or the hidden layer), an input h of a neuron at a next layer is obtained after weighted summation is performed, based on the initial neuron parameter (an initial weight value w is set on each connection line between two layers, and an initial bias vector b is set on each node) (a specific value of the neuron parameter is not shown in FIG. 6, and reference may be made to the conventional technology for a setting manner, which is not described in this application), on an output x at a current layer connected to the next layer and then an activation function is applied to a result of the summation. An input h of each neuron is shown in Formula (5).

$$h = f(wx + b) \quad (5)$$

In this case, an output y of the neural network (that is, the output information 4 output by the initial neural network in this embodiment of this application) may be recursively expressed as:

$$y = f_n(w_n f_{n-1} + b_n) \quad (6)$$

Still with reference to FIG. 6, an operation is performed on the input information 4: [0, 1] of the initial neural network unit according to Formula (5) and Formula (6), to obtain the output information (to be distinguished from another training result, the output information is referred to as a training result 1 below).

Subsequently, the encoding apparatus obtains an error between the training result 1 and an expected check result [1, 1]. A method for calculating the error value is described above. In other words, the error value may be a difference or a mean square error between the training result 1 and the expected check result. For specific details of obtaining the loss function, refer to technical embodiments in the conventional technology. Details are not described in this application.

(2) Back Propagate the Error.

Specifically, the encoding apparatus may back propagate the error, calculate a residual of the output layer, perform weighted summation on residuals of nodes at each layer, then update a weight of a first layer (that is, a weight between the input layer and the hidden layer) based on a learning rate and a residual of each node at the input layer, and cycle the foregoing method to update a corresponding weight layer by layer. Then, the input information 4 is trained again by using the updated weight, to obtain a training result 2. In addition, the foregoing steps are cycled, that is, the initial neuron parameter is repeatedly updated until an error between a training result n output by the initial neural network and an expected check result is less than a target value (for example, the target value may be 0.0001), to confirm that the training result converges.

The foregoing training method is a gradient descent method. The encoding apparatus may iteratively optimize the initial weight value w and the initial bias vector b by using the gradient descent method, so that the loss function reaches a minimum value. For specific details of the gradient descent method, refer to technical embodiments in the conventional technology. Details are not described in this application.

It should be noted that the encoding apparatus may further train the initial neural network unit and another neural network in this embodiment of this application by using another training method. Objectives of the training methods are all to make an output value of the neural network close to an optimization target and to update the neuron parameter in the neural network unit.

Figure 7:
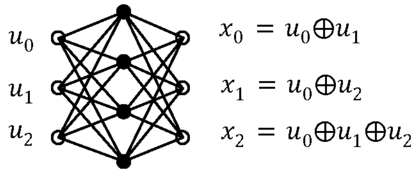
FIG. 7 is a schematic structural diagram of an initial neural network unit according to an embodiment of this application.

In an embodiment, if the encoding apparatus generates the initial neural network unit based on a kernel matrix $$T_3 = \begin{bmatrix} 1 & 1 & 1 \\ 1 & 0 & 1 \\ 0 & 1 & 1 \end{bmatrix},$$

the generated initial neural network unit is shown in FIG. 7. For the input information $[u_0, u_1, u_2]$, the expected check result that is of the input information and that is obtained based on $T_3$ is $x_0=u_0 \oplus u_1$, $x_1=u_0 \oplus u_2$, and $x_2=u_0 \oplus u_1 \oplus u_2$.

Figure 8:
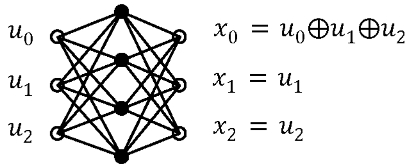
FIG. 8 is a schematic structural diagram of an initial neural network unit according to an embodiment of this application.

In another embodiment, if the encoding apparatus generates the initial neural network unit based on the kernel matrix $$T_3 = \begin{bmatrix} 1 & 0 & 0 \\ 1 & 1 & 0 \\ 1 & 0 & 1 \end{bmatrix},$$

the generated initial neural network unit is shown in FIG. 8. For the input information $[u_0, u_1, u_2]$, the expected check result that is of the input information and that is obtained based on $T_3$ is $x_0=u_0 \oplus u_1 \oplus u_2$, $x_1=u_1$, and $x_2=u_2$.

Figure 9:
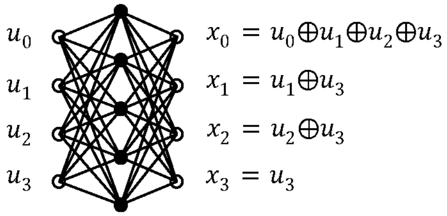
FIG. 9 is a schematic structural diagram of an initial neural network unit according to an embodiment of this application.

In still another embodiment, if the encoding apparatus generates the initial neural network unit based on a kernel matrix $$T_4 = T_2 \otimes T_2 = \begin{bmatrix} 1 & 0 & 0 & 0 \\ 1 & 1 & 0 & 0 \\ 1 & 0 & 1 & 0 \\ 1 & 1 & 1 & 1 \end{bmatrix},$$

the generated initial neural network unit is shown in FIG. 9. For the input information $[u_0, u_1, u_2, u_3]$, the expected check result that is of the input information and that is obtained based on $T_4$ is $x_0=u_0 \oplus u_1 \oplus u_2 \oplus u_3$, $x_1=u_1 \oplus u_3$, $x_2=u_2 \oplus u_3$, and $x_3=u_3$.

Still with reference to FIG. 5, in this embodiment of this application, the trained initial neural network unit is the neural network unit in this embodiment of this application. After the initial neural network unit is trained, the initial neuron parameter included in the initial neural network unit is updated to a neuron parameter (that is, a third neuron parameter in this embodiment of this application, which is referred to as a neuron parameter 3 below).

In this embodiment of this application, a result that can be achieved by the neural network unit is that after input encoding information or training information (for example, input information 3) is encoded based on the neuron parameter 3 included in the neural network unit and the activation function, output information 3 that is output is equal to or close to an expected check result of the input information 3.

It should be noted that, for the same input information and the same training manner, because initial neuron parameters included in initial neural network units are different, neuron parameters included in neural network units obtained after the initial neural network units are trained are also different. To be specific, there may be a plurality of initial neural network units corresponding to one kernel matrix. The initial neural network units include different neuron parameters, and output the same output information. In other words, although the plurality of initial neural network units include different neuron parameters, encoding capabilities are the same.

Step 702: Generate an initial encoding neural network.

Specifically, in this embodiment of this application, the encoding apparatus may generate the initial encoding neural network based on the neural network unit generated in step 701. In other words, the initial encoding neural network includes one or more neural network units. The initial encoding neural network includes a neuron parameter 2. The neuron parameter 2 includes the neuron parameter 3 included in the neural network unit. To be specific, the neuron parameter 2 included in the one or more neural network units forming the initial encoding neural network forms the initial neuron parameter of the initial encoding neural network. Then, the encoding apparatus trains the initial encoding neural network to update the initial neuron parameter.

Figure 10:
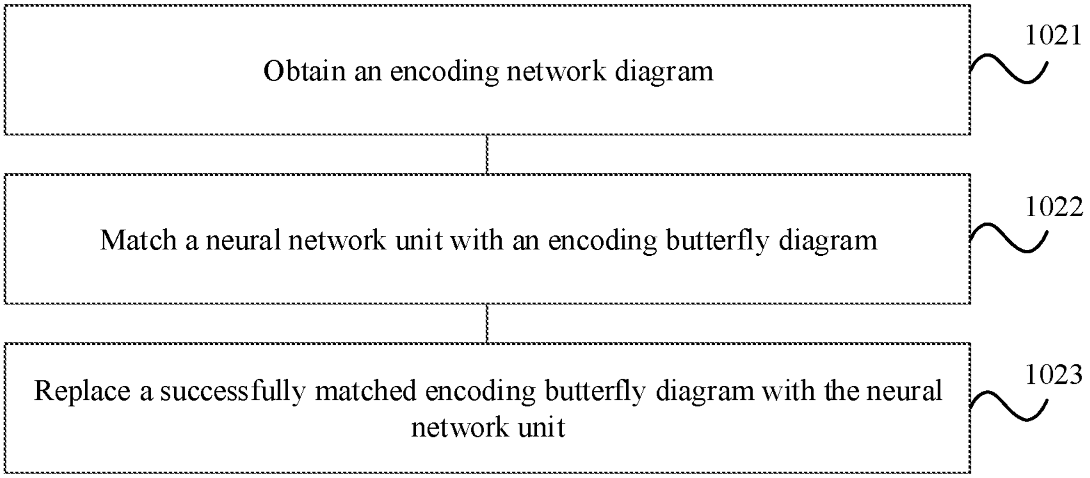
FIG. 10 is a schematic flowchart of generating an initial encoding neural network according to an embodiment of this application.

Specifically, FIG. 10 is a schematic flowchart of a step of generating the initial encoding neural network. In FIG. 10, Step 1021: Obtain an encoding network diagram.

Figure 11:
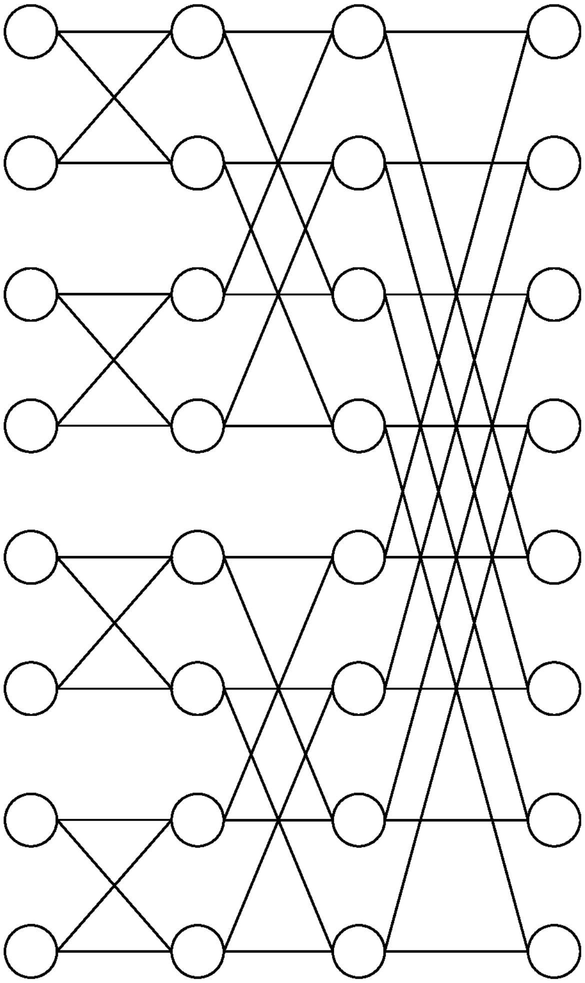
FIG. 11 is a schematic structural diagram of an encoding network diagram according to an embodiment of this application.

Specifically, in this embodiment of this application, the encoding apparatus may obtain the encoding network diagram. The encoding network diagram includes at least one encoding butterfly diagram. The encoding butterfly diagram is used to indicate a check relationship between input information of the encoding butterfly diagram and output information of the encoding butterfly diagram. It should be noted that the encoding network diagram may be provided by the system. FIG. 11 shows a type of encoding network diagram.

Step 1022: Match the neural network unit with the encoding butterfly diagram.

Step 1023: Replace a successfully matched encoding butterfly diagram with the neural network unit.

Specifically, for example, with reference to Formula (2), if an initial encoding neural network corresponding to Formula (7) needs to be generated, $$G = T_2 \otimes T_2 \ \ldots \ \ldots \ \otimes T_2 = T_2^{\otimes n} \tag{7}$$

the encoding butterfly diagram that successfully matches the neural network unit generated based on $T_2$ and that is in the encoding network diagram in FIG. 11 may be replaced with the neural network unit generated based on $T_2$.

Specifically, the encoding apparatus separately matches the neural network unit with the encoding butterfly diagram in the encoding network diagram. The matching manner is as follows.

Figure 12:
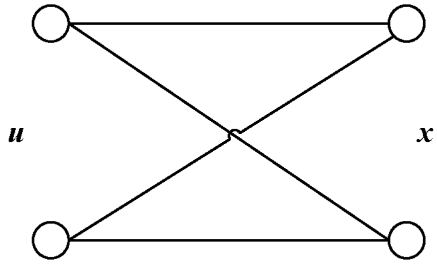
FIG. 12 is a schematic structural diagram of an encoding butterfly diagram according to an embodiment of this application.
Figure 13:
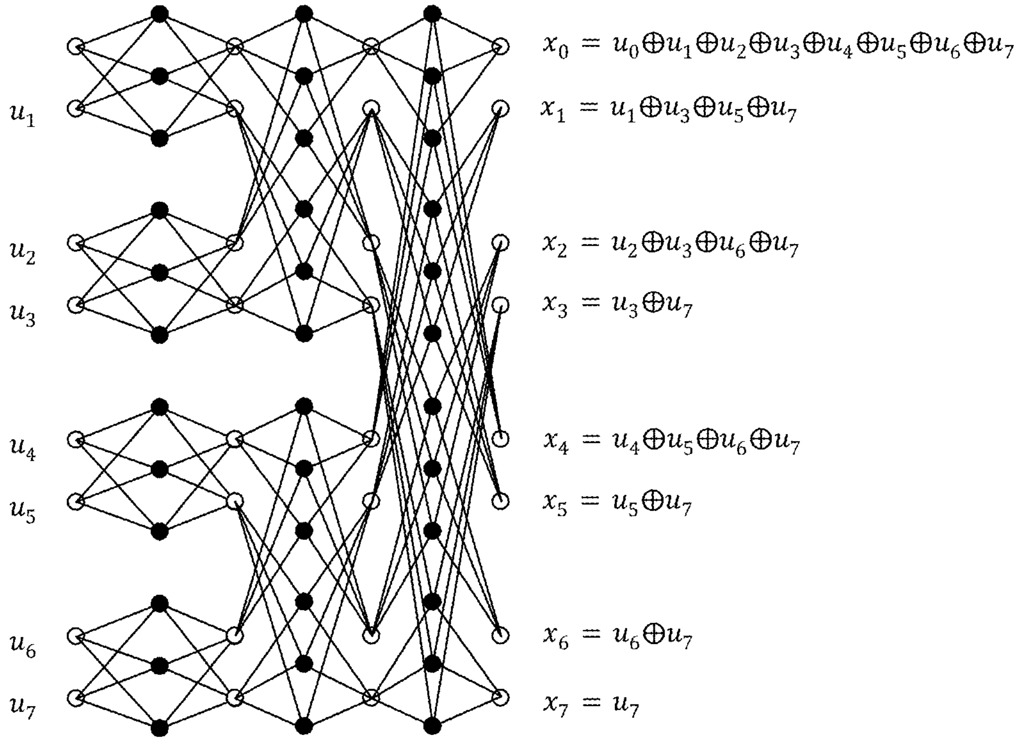
FIG. 13 is a schematic structural diagram of an initial encoding neural network according to an embodiment of this application.

For example, reference may be made to FIG. 6 for the neural network unit (to be distinguished from another neural network unit, the neural network unit is referred to as a neural network unit 1 below) generated based on $T_2$. In other words, code lengths of input information and output information of the neural network unit 1 are both 2, to confirm that the neural network unit 1 is a 2×2 neural network unit. The encoding apparatus may search the encoding network diagram for an encoding butterfly diagram with the same 2×2 structure. The encoding butterfly diagram with the 2×2 structure is shown in FIG. 12.

Then, the encoding apparatus may replace, with the neural network unit 1, all encoding butterfly diagrams that successfully match the neural unit 1 in the encoding network diagram and that have the 2×2 structure, to obtain the initial encoding neural network. As shown in FIG. 12, It should be noted that, as described above, for the same kernel matrix, there may correspondingly be a plurality of neural network units that have different neuron parameters, and the plurality of neural network units may be used as a neural network unit set corresponding to the same kernel matrix. Optionally, in an embodiment, the initial encoding neural network may include any one or more neural network units in the neural network unit set. In other words, the encoding butterfly diagram in the encoding network diagram may be replaced with any one or more neural network units in the neural network unit set.

Optionally, in another embodiment, according to Formula (8), $$G = T_{n1} \otimes T_{n2} \ldots \ldots \otimes T_{ns} \quad (8)$$

it may be learned that the initial encoding neural network corresponding to a generator matrix G may include neural network units that correspond to different kernel matrices and that are in the neural network unit set.

For example, a neural network unit set 1 corresponding to the kernel matrix $T_2$ includes {a neural network unit 1, a neural network unit 2, and a neural network unit 3}, and a neural network set 2 corresponding to the kernel matrix $T_3$ includes {a neural network unit 4, a neural network unit 5, and a neural network unit 6}. In this case, the encoding network diagram obtained by the encoding apparatus includes at least one encoding butterfly diagram with the 2×2 structure and at least one encoding butterfly diagram with a 3×3 structure. Then, the encoding apparatus may match each of the neural network unit 1, the neural network unit 3, and the neural network unit 5 with an encoding butterfly diagram, and replace a successfully matched encoding butterfly diagram with the neural network unit, to obtain the initial encoding neural network.

Step 703: Train the initial encoding neural network, to obtain an encoding neural network.

Specifically, in this embodiment of this application, the encoding apparatus may train the initial encoding neural network based on the activation function and the neuron parameter 2 (including the neuron parameter 1) of the initial encoding neural network until an error between output information 2 output by the initial encoding neural network and an expected check result of input information 2 is less than a threshold. In addition, after the initial encoding neural network is trained, the neuron parameter 2 is updated.

In this embodiment of this application, the trained initial encoding neural network is the encoding neural network, the updated neuron parameter 2 is the neuron parameter 1 corresponding to the encoding neural network. The neuron parameter 1 is used to indicate a mapping relationship between input information 1 input to the encoding neural network and output information 1 output by the encoding neural network.

For a specific step of training the initial encoding neural network, refer to the training step of the neural network unit. Details are not described herein again.

Step 704: Obtain input information.

Specifically, in this embodiment of this application, the encoding apparatus may obtain, from another apparatus (for example, an input apparatus of a terminal) that has a communication connection to the encoding apparatus, information that needs to be encoded (that is, to-be-encoded information in this embodiment of this application), that is, the input information.

Step 705: Encode the input information based on the encoding neural network, to obtain and output output information.

Specifically, in this embodiment of this application, the encoding apparatus may encode the obtained input information (to be distinguished from other input information, the input information is referred to as the input information 1 below) based on the generated encoding neural network, to obtain and output the output information 1. A specific encoding process is as follows: The encoding apparatus performs weighted summation on the input information 1 based on the neuron parameter 1, and then performs an operation based on the activation function to obtain the output information 1. For specific details, refer to technical embodiments in the conventional technology. Details are not described in this application.

In conclusion, in the technical solutions in this embodiment of this application, the corresponding neural network unit may be generated based on the kernel matrix, and then the encoding network may consist of the neural network unit. In this way, the large neural network is obtained after small neural network units are connected, so that in an encoding learning process, generalization can be implemented to entire codeword space by using a small learning sample, to weaken impact of information with a relatively long codeword, for example, the polar code, on complexity and learning difficulty of the neural network.

Scenario 2

Scenario 1 is mainly used as a detailed example of a process for generating the encoding network based on the polar code. The encoding method in this embodiment of this application may be used as a general encoding method, that is, may be used as another encoding manner, for example, Reed-Solomon (RS) code, Hamming code, Bose-Chaudhuri-Hocquenghem (BCH) code, convolutional code, turbo code, and low-density parity-check (LDPC) code (which is referred to as general encoding below).

Figure 14:
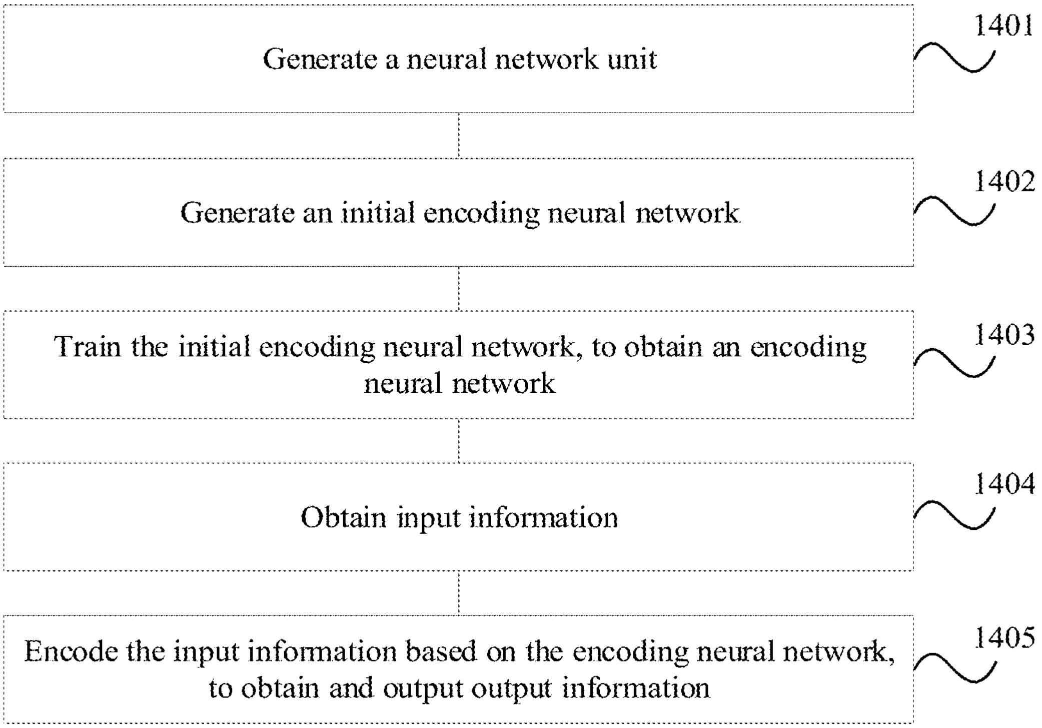
FIG. 14 is a schematic flowchart of an encoding method according to an embodiment of this application.

With reference to FIG. 1, FIG. 14 is a schematic flowchart of an encoding method according to an embodiment of this application. In FIG. 14, Step 1401: Generate a neural network unit.

Specifically, in this embodiment, for the general encoding, a codeword c that has input information u with any length $k_1$ may be represented by using Formula (9):

$$c = uG \quad (9)$$

An information bit length of u is $k_2$. In this case, dimensions of the encoding matrix G are $k_1 \times k_2$.

Similarly, the encoding apparatus may generate an initial neural network unit corresponding to a kernel matrix.

To better understand the technical solutions in this application, the following is described in detail by using an example of Hamming code in the general encoding. It should be noted that, for the Hamming code, the encoding matrix is the same as the kernel matrix, that is, G=T.

Figure 15:
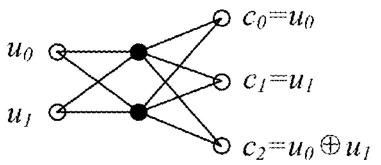
FIG. 15 is a schematic structural diagram of an initial neural network unit according to an embodiment of this application.

In an example in which the kernel matrix is $$G = \begin{bmatrix} 1 & 0 & 1 \\ 0 & 1 & 1 \end{bmatrix},$$

the generated initial neural network unit is shown in FIG. 15.

If the input information u=[0, 1], an expected check result of the input information u is c=uG=[0, 1, 0].

Then, the encoding apparatus trains the initial neural network unit until the output information is close to the expected check result. For specific details of the training, refer to Scenario 1. Details are not described herein again.

Step 1402: Generate an initial encoding neural network.

For the Hamming code, the encoding apparatus may replace a butterfly diagram in an obtained encoding network diagram with the neural network unit, to obtain the initial encoding neural network. This is the same as Scenario 1. For specific details, refer to Scenario 1. Details are not described herein again.

Step 1403: Train the initial encoding neural network, to obtain an encoding neural network.

For specific details of this step, refer to Scenario 1. Details are not described herein again.

Step 1404: Obtain input information.

For specific details of this step, refer to Scenario 1. Details are not described herein again.

Step 1405: Encode the input information based on the encoding neural network, to obtain and output output information.

For specific details of this step, refer to Scenario 1. Details are not described herein again.

Scenario 3

Figure 16:
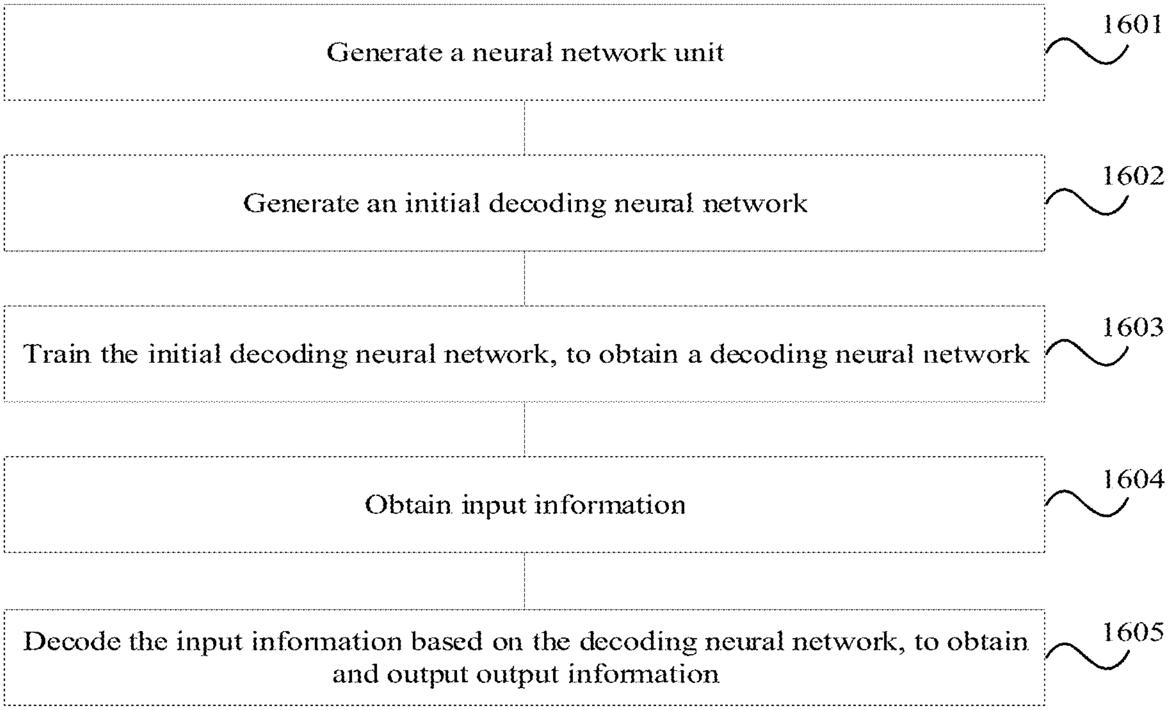
FIG. 16 is a schematic flowchart of a decoding method according to an embodiment of this application.

With reference to FIG. 1, FIG. 16 is a schematic flowchart of a decoding method according to an embodiment of this application. In FIG. 16, Step 1601: Generate a neural network unit.

Specifically, in this embodiment of this application, a decoding apparatus may generate an initial neural network unit based on a kernel matrix, and then the decoding apparatus trains the initial neural network unit, so that an output value of the initial neural network unit is close to an expected optimization target. In this case, the trained initial neural network unit is the neural network unit. After the training, an initial neuron parameter included in the initial neural network unit is updated to a neuron parameter included in the neural network unit. In addition, that the output value is close to the expected optimization target is that an error between output information output by the initial neural network unit and an expected check result corresponding to input information input to the initial neural network unit is less than a threshold. In this embodiment of this application, the expected check result of the input information is obtained after a multiplication operation and an addition operation are performed on the input information in a GF(2) based on a kernel matrix corresponding to the initial neural network unit.

The following describes in detail a method for generating the neural network unit with reference to polar code.

Specifically, a decoding formula for the polar code may be indicated by using the following Formula (10):

$$x = yG \tag{10}$$

Herein, x is output information of the neural network unit, and y is input information of the neural network unit. It should be noted that, in Scenario 1, input of each neural network unit or neural network is bit information, and the encoding neural network outputs encoded bit information, and converts the bit information into a likelihood ratio after channel processing. Therefore, in this scenario, input information of both the neural network unit and the neural network are the likelihood ratio output through a channel.

In this embodiment of this application, the decoding apparatus obtains, according to Formula (10) and Formula (2) (n in Formula (2) is 1), the expected check result corresponding to the input information of the initial neural network unit, and generates the initial neural network unit based on the input information and the expected check result of the input information.

Figure 17:
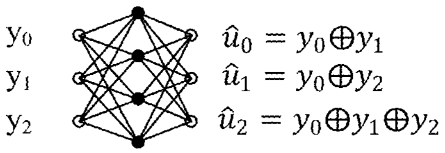
FIG. 17 is a schematic structural diagram of an initial neural network unit according to an embodiment of this application.

For example, if $$T_3 = \begin{bmatrix} 1 & 1 & 1 \\ 1 & 0 & 1 \\ 0 & 1 & 1 \end{bmatrix},$$

the initial neural network unit is shown in FIG. 17. For the input information $[y_0, y_1, y_2]$, the expected check result that is of the input information and that is obtained based on $T_3$ is $\hat{x}_0=y_0 \oplus y_1$, $\hat{x}_1=y_0 \oplus y_2$, and $\hat{x}_2=y_0 \oplus y_1 \oplus y_2$.

Figure 18:
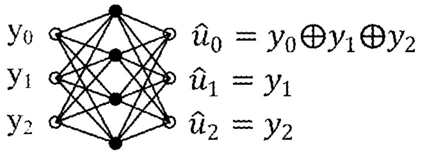
FIG. 18 is a schematic structural diagram of an initial neural network unit according to an embodiment of this application.

If $$T_3 = \begin{bmatrix} 1 & 0 & 0 \\ 1 & 1 & 0 \\ 1 & 0 & 1 \end{bmatrix},$$

the initial neural network unit is shown in FIG. 18. For the input information $[y_0, y_1, y_2]$, the expected check result that is of the input information and that is obtained based on $T_3$ is $\hat{x}_0=y_0 \oplus y_1 \oplus y_2$, $\hat{x}_1=y_1$, and $\hat{x}_2=y_2$.

Figure 19:
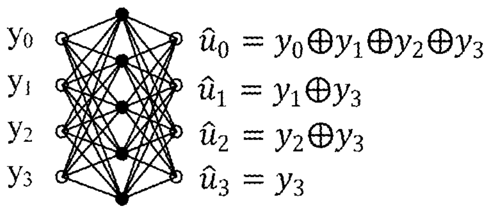
FIG. 19 is a schematic structural diagram of an initial neural network unit according to an embodiment of this application.

If $$T_4 = T_2 \otimes T_2 = \begin{bmatrix} 1 & 0 & 0 & 0 \\ 1 & 1 & 0 & 0 \\ 1 & 0 & 1 & 0 \\ 1 & 1 & 1 & 1 \end{bmatrix},$$

the initial neural network unit is shown in FIG. 19.

For the input information $[y_0, y_1, y_2, y_3]$, the expected check result that is of the input information and that is obtained based on $T_4$ is $\hat{x}_0=y_0 \oplus y_1 \oplus y_2 \oplus y_3$, $\hat{x}_1=y_1 \oplus y_3$, $\hat{x}_2=y_2 \oplus y_3$, and $\hat{x}_3=y_3$.

For specific details of generating the initial neural network unit, refer to Scenario 1. Details are not described herein again.

Then, the decoding apparatus trains the initial neural network unit, to obtain the neural network unit. For a specific training process, refer to Scenario 1. Details are not described herein again.

Step 1602: Generate an initial decoding neural network.

Specifically, in this embodiment of this application, the decoding apparatus may generate the initial decoding neural network based on the neural network unit generated in step 1601. In other words, the initial encoding neural network includes one or more neural network units.

For specific details, refer to Scenario 1. Details are not described herein again.

Step 1603: Train the initial decoding neural network, to obtain a decoding neural network.

Specifically, in this embodiment of this application, the decoding apparatus may train the initial decoding neural network to make output information of the initial decoding neural network close to an expected decoding result, and update a neuron parameter included in the decoding neural network. The trained initial decoding neural network is the decoding neural network.

Specifically, in this embodiment of this application, a process in which the decoding apparatus trains the decoding neural network based on training information is different from the training process of the encoding neural network in Scenario 1. In the training process of the encoding neural network, the input information (that is, the training information) is trained, then the error between the output information and the expected check result of the input information is obtained, another training step is performed based on the error, and the neuron parameter is updated. However, in the training process of the decoding neural network, because the training information input to the decoding neural network is a likelihood ratio, in the decoding neural network, a process of calculating a loss parameter is calculating a loss function based on the output information and an expected decoding result. The expected decoding result is obtained in the following manner: Any encoding apparatus (may be the encoding apparatus in the embodiments of this application, or may be another type of encoding apparatus) encodes encoding information (the encoding information is bit information), and outputs an encoding result. The encoding result is also bit information. The encoding information is the expected decoding result in this embodiment. In other words, the training information input to the decoding neural network is the likelihood ratio generated after channel processing is performed on the encoding result. Therefore, an expected output value (that is, the expected decoding result) of the decoding neural network should be the encoding information.

Step 1604: Obtain the input information.

For specific details of this step, refer to Scenario 1. Details are not described herein again.

Step 1605: Decode the input information based on the decoding neural network, to obtain and output the output information.

Specifically, in this embodiment of this application, the decoding apparatus may decode the received input information based on the generated decoding neural network, to obtain and output the output information. A specific decoding process is as follows: The decoding apparatus performs weighted summation on the input information based on the neuron parameter, and then performs an operation based on the activation function to obtain the output information. For specific details, refer to technical embodiments in a conventional technology. Details are not described in this application.

In conclusion, in the technical solutions in this embodiment of this application, the corresponding neural network unit may be generated based on the kernel matrix, and then the decoding neural network may consist of the neural network unit. In this way, the large neural network is obtained after small neural network units are connected, so that in a decoding learning process, generalization can be implemented to entire codeword space by using a small learning sample, to weaken impact of information with a relatively long codeword, for example, the polar code, on complexity and learning difficulty of a neural network.

Optionally, the decoding method in this embodiment of this application may also be applied to another encoding manner (that is, general encoding), for example, Hamming code. For specific details, refer to Scenario 1, Scenario 2, and Scenario 3. Details are not described herein again.

Scenario 4

Figure 20:
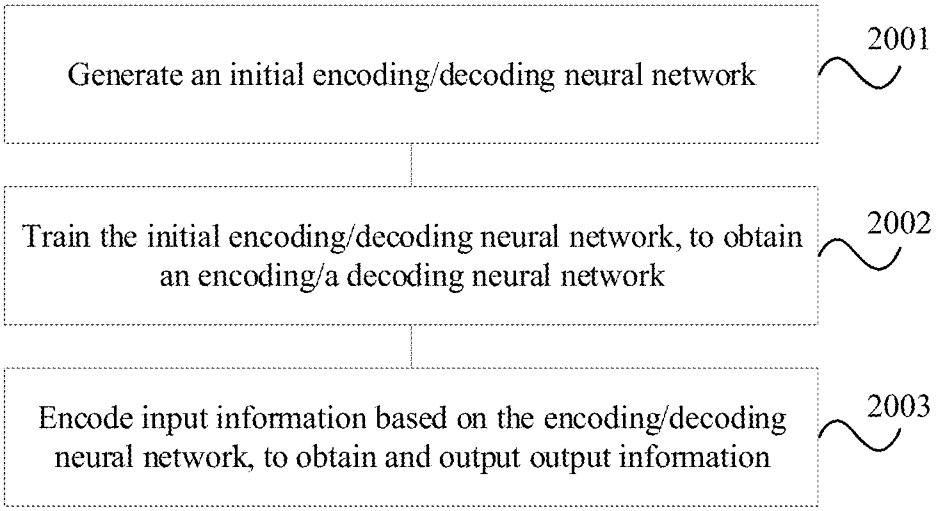
FIG. 20 is a schematic flowchart of an encoding/a decoding method according to an embodiment of this application.

With reference to FIG. 1, FIG. 20 is a schematic flowchart of an encoding/a decoding method according to an embodiment of this application. In FIG. 20, Step 2001: Generate an initial encoding/decoding neural network.

Specifically, in this embodiment of this application, an encoding/a decoding apparatus may generate the initial encoding/decoding neural network based on the encoding neural network and the decoding neural network described above.

Optionally, in an embodiment, the encoding neural network and the decoding neural network in the generated initial encoding/decoding neural network may have the same neuron parameter. For example, for polar code, the encoding neural network and the decoding neural network in the generated initial encoding/decoding neural network may have the same neuron parameter.

Optionally, in another embodiment, the encoding neural network and the decoding neural network in the generated initial encoding/decoding neural network may have different neuron parameters. For example, for Hamming code, the encoding neural network and the decoding neural network in the generated initial encoding/decoding neural network may have different neuron parameters.

In this embodiment, the polar code is used as an example for detailed description.

Specifically, the encoding/decoding apparatus may obtain the encoding neural network generated by the encoding apparatus. The training process in Scenario 1 has been completed for the encoding neural network. In other words, output information of the encoding neural network is close to an expected check result.

Then, the encoding/decoding apparatus may obtain the decoding neural network generated by the decoding apparatus. The decoding neural network may be a decoding neural network for which the training is completed. In other words, output information of the decoding neural network is close to an expected check result. Alternatively, the decoding neural network may be an initial decoding neural network for which the training is not performed, that is, a decoding neural network that has only an initial neuron parameter.

Then, the encoding/decoding apparatus may implement parameter sharing for the obtained encoding neural network and the obtained decoding neural network. In other words, a neuron parameter in the decoding neural network (or the initial decoding neural network) is replaced with a neuron parameter in the encoding neural network, to generate the initial encoding/decoding neural network.

In another embodiment, the encoding/decoding apparatus may alternatively obtain a decoding neural network for which the training is completed, and obtain an encoding neural network for which the training is completed, or the initial encoding neural network for which the training is not completed. The encoding/decoding apparatus may replace a neuron parameter in the encoding neural network (or the initial encoding neural network) with a neuron parameter in the decoding neural network, to generate the initial encoding/decoding neural network.

Step 2002: Train the initial encoding/decoding neural network, to obtain an encoding/a decoding neural network.

Specifically, in this embodiment of this application, the encoding/decoding apparatus trains the initial encoding/decoding neural network. The trained initial encoding/decoding neural network is the encoding/decoding neural network.

Figure 21:
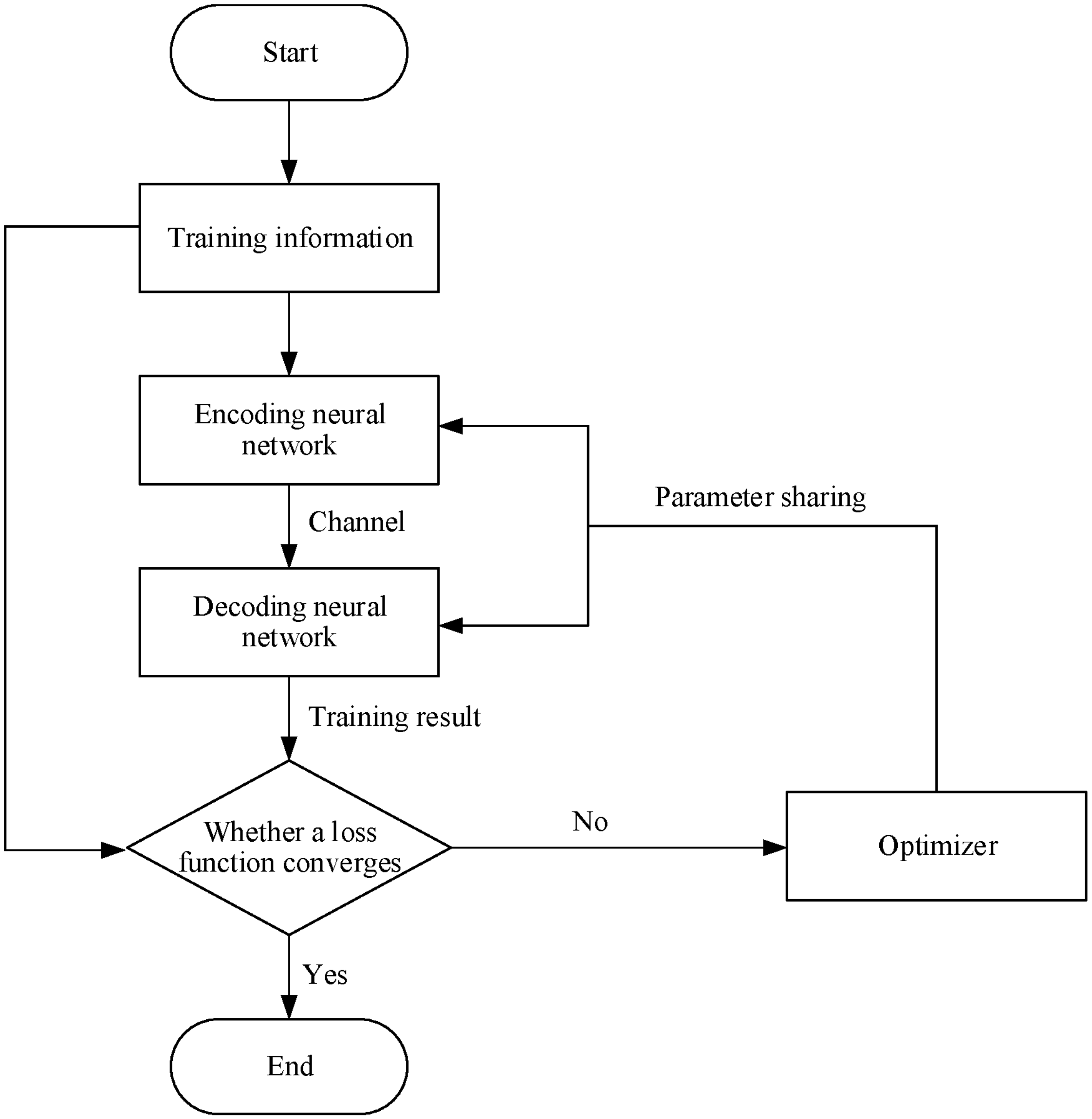
FIG. 21 is a schematic flowchart of a training method of an encoding/a decoding neural network according to an embodiment of this application.

FIG. 21 is a schematic flowchart of a method for training an initial encoding/decoding neural network. In FIG. 21, The encoding/decoding apparatus inputs input information on an encoding neural network side of the encoding/decoding neural network. The input information may also be referred to as training information. A code length of the training information is the same as a code length of the encoding/decoding neural network.

Then, the encoding neural network in the initial encoding/decoding neural network encodes the training information, to obtain and output an encoding result. Then, after channel processing is performed on the encoding result, the processed result is input to the decoding neural network. The encoding result input to a decoding neural network side is a likelihood ratio.

Then, the decoding neural network side decodes the input likelihood ratio, to obtain and output a decoding result. The decoding result may also be referred to as a training result.

In this embodiment, the input training information is an expected check result of the encoding/decoding neural network. The encoding/decoding apparatus may obtain a loss function based on the training information and the training result. A manner of obtaining the loss function may also be a function such as a mean square error or a difference. In addition, the encoding/decoding apparatus determines whether a result of the loss function converges, that is, whether an error between the training information and the training result is greater than a threshold (for specific details of calculating the error, refer to the embodiment in the foregoing Scenario 1). If the error is less than the threshold, the training ends. If the error is greater than or equal to the threshold, a next step is continuously performed.

In this embodiment, when the error is greater than or equal to the threshold, the encoding/decoding apparatus may optimize the encoding/decoding neural network by using an optimizer. An optimization method includes but is not limited to: performing iteration on the encoding/decoding neural network in a manner such as gradient descent, updating a neuron parameter in the encoding/decoding network, and sharing the updated neuron parameter with the encoding neural network and the decoding neural network. Then, the encoding/decoding apparatus repeats the foregoing training steps until the error between the training result and the training information is less than the threshold, or a training round quantity reaches a training round quantity threshold, or training duration reaches a training duration threshold.

The trained initial encoding/decoding neural network is the encoding/decoding neural network.

Step 2003: Encode the input information based on the encoding/decoding neural network, to obtain and output the output information.

Specifically, in this embodiment of this application, the trained encoding/decoding neural network may be divided into an encoding neural network part and a decoding neural network part. The encoding/decoding neural network encodes the input information by using the encoding neural network part, to obtain and output the encoding result. Then, the decoding neural network part decodes the encoding result, to obtain and output a decoding result (the decoding result is the output information, and the decoding result is the same as the input information).

The encoding neural network may be set in a terminal and/or a base station, and the decoding neural network may be set in a terminal and/or a base station.

Specifically, when the terminal sends a signal to the base station, the encoding neural network part in the terminal encodes to-be-encoded information (that is, input information), obtains and outputs an encoding result, and transmits the encoding result to the base station through a channel. After receiving the encoding result, the base station decodes the encoding result by using the decoding neural network, to obtain and output a decoding result, that is, the to-be-encoded information.

When the base station sends a signal to the terminal, the encoding neural network part in the base station encodes to-be-encoded information, obtains and outputs an encoding result, and transmits the encoding result to the terminal through a channel. After receiving the encoding result, the terminal decodes the encoding result by using the decoding neural network, to obtain and output a decoding result, that is, the to-be-encoded information.

It should be noted that, in the encoding/decoding neural network for Hamming code and the like that includes the encoding neural network and the decoding neural network having different neuron parameters, encoding and decoding may be directly performed by using encoding and decoding neural networks on two sides without training.

In conclusion, in the technical solutions in this embodiment of this application, parameters are shared between the encoding neural network and the decoding neural network, thereby improving performance of the encoding/decoding neural network and reducing complexity. In addition, by using the encoding/decoding neural network including the encoding neural network and the decoding neural network, learning costs and difficulty are reduced, and learning efficiency is effectively improved.

Optionally, in an embodiment, the encoding/decoding method in this embodiment of this application may also be applied to a multi-element field. In an example of polar code, specifically, a generator matrix of binary polar code consists of two elements "0" and "1", a generator matrix of multi-element polar code may consist of a zero element and a non-zero element in a GF($2^m$) (m is an integer greater than 1). Similar to the binary polar code, the generator matrix of the multi-element polar code may still be obtained through a Kronecker product operation based on a kernel matrix. An example of $$T_2 = \begin{bmatrix} 1 & 0 \\ 1 & 1 \end{bmatrix}$$

in Scenario 1 is used. In this embodiment, 1 in $$T_2 = \begin{bmatrix} 1 & 0 \\ 1 & 1 \end{bmatrix}$$

is replaced with a non-zero element in GF($2^m$). For example, $$T_2 = \begin{bmatrix} \alpha^j & 0 \\ \alpha^k & \alpha^l \end{bmatrix}.$$

Figure 22:
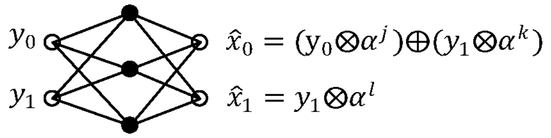
FIG. 22 is a schematic structural diagram of an initial neural network unit according to an embodiment of this application.

Herein, j, k, and l are natural numbers. The generator matrix G of the multi-element polar code may be represented as $$\begin{bmatrix} \alpha^j & 0 \\ \alpha^k & \alpha^l \end{bmatrix}^{\otimes n}$$

according to Formula (2). In the multi-element field, a neural network unit corresponding to $$T_2 = \begin{bmatrix} \alpha^j & 0 \\ \alpha^k & \alpha^l \end{bmatrix}$$

is shown in FIG. 22. For the input information $[y_0, y_1]$, the expected check result that is of the input information and that is obtained based on $T_2$ is $\hat{x}_0=(y_0 \otimes a^j) \otimes (y_1 \otimes a^k)$, and $\hat{x}_1=y_1 \otimes a^l$.

For a manner of generating the encoding neural network or the decoding neural network based on the neural network unit generated in the multi-element field, refer to the descriptions in Scenario 1 to Scenario 3. Details are not described herein again.

Optionally, in an embodiment, in a process in which the encoding apparatus, the decoding apparatus, and/or the encoding/decoding apparatus in this embodiment of this application train/trains the neural network unit or the neural network (indicating the encoding neural network, the decoding neural network, and/or the encoding/decoding neural network), a preset condition may be further set. When the preset condition is reached in the training process, the training is stopped. The preset condition includes but is not limited to: A training round quantity is greater than a training round quantity threshold, that is, the training may be stopped when the training round quantity reaches the training round quantity threshold; or training duration is greater than a training duration threshold, that is, the training may be stopped when the training duration reaches the training duration threshold. Another preset condition may be further set. This is not limited in this application. It should be noted that a plurality of training conditions may be set. For example, the training condition may be A: a loss function is less than a loss function threshold (that is, the error between the output information and the expected check result in this embodiment of this application is less than the threshold); or the training condition may be B: the training round quantity is greater than the training round quantity threshold. When the loss function does not reach the loss function threshold, but the training round quantity has reached the training round quantity threshold, the training may be stopped. In this way, a training time is reduced, and resources are saved.

Optionally, in this embodiment of this application, in a training phase, input of each neural network unit and neural network is training information; and in an encoding phase, input of each neural network unit and neural network is to-be-encoded information. Training information of neural network units or neural networks with the same structure may be the same as or different from encoding information of the neural network units or the neural networks. This is not limited in this application.

Optionally, in an embodiment, the training phase (including a training part for the neural network unit and a training part for the neural network (the encoding neural network, the decoding neural network, and/or the encoding/decoding neural network)) may be implemented online, that is, the training result is directly used as input information to be input to the encoding apparatus. In another embodiment, the training phase may be alternatively implemented offline, that is, before the neural network unit and the neural network in this embodiment of this application are applied, training for the neural network unit and the neural network is completed.

Figure 23:
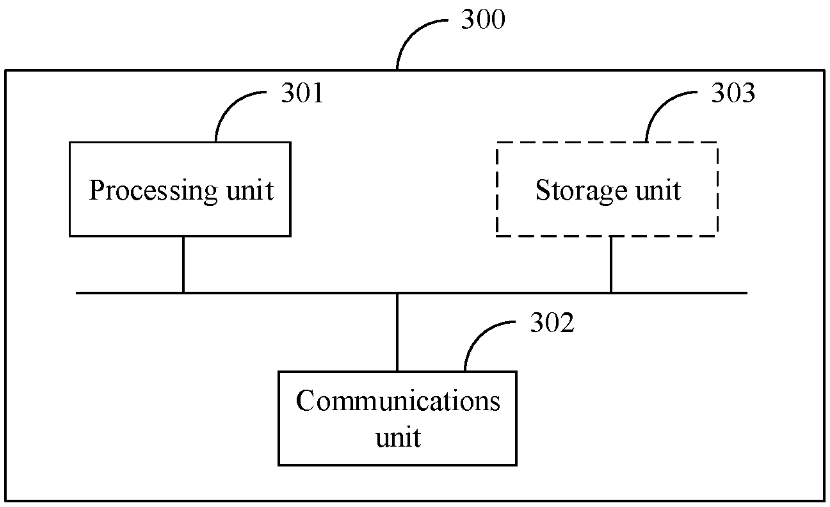
FIG. 23 is a schematic structural diagram of an encoding apparatus according to an embodiment of this application.

The following describes an encoding apparatus 300 provided in an embodiment of this application. The following is shown in FIG. 23.

The encoding apparatus 300 includes a processing unit 301 and a communications unit 302. Optionally, the encoding apparatus 300 further includes a storage unit 303. The processing unit 301, the communications unit 302, and the storage unit 303 are connected by using a communications bus.

The storage unit 303 may include one or more memories. The memory may be a component configured to store a program or data in one or more devices or circuits.

The storage unit 303 may exist independently, and is connected to the processing unit 301 by using the communications bus. The storage unit may alternatively be integrated together with the processing unit 301.

The encoding apparatus 300 may be the terminal in the embodiments of this application, for example, the terminal 200. A schematic diagram of the terminal may be shown in FIG. 2*b*. Optionally, the communications unit 302 of the encoding apparatus 300 may include an antenna and a transceiver of the terminal, for example, the antenna 205 and the transceiver 202 in FIG. 2*b*.

The encoding apparatus 300 may be a chip in the terminal in the embodiments of this application, for example, a chip in the terminal 200. The communications unit 302 may be an input/output interface, a pin, a circuit, or the like. Optionally, the storage unit may store computer-executable instructions of a method on a terminal side, so that the processing unit 301 performs the encoding methods in the foregoing embodiments. The storage unit 303 may be a register, a cache, a RAM, or the like, and the storage unit 303 may be integrated with the processing unit 301. The storage unit 303 may be a ROM or another type of static storage device that can store static information and instructions, and the storage unit 303 may be independent of the processing unit 301. Optionally, with development of wireless communications technologies, the transceiver may be integrated into the encoding apparatus 300. For example, the transceiver 202 is integrated into the communications unit 302.

The encoding apparatus 300 may be the base station in the embodiments of this application, for example, the base station 100. A schematic diagram of the base station 100 may be shown in FIG. 2*a*. Optionally, the communications unit 302 of the encoding apparatus 300 may include an antenna and a transceiver of the base station, for example, the antenna 105 and the transceiver 103 in FIG. 2*a*. The communications unit 302 may further include a network interface of the base station, for example, the network interface 104 in FIG. 2*a*.

The encoding apparatus 300 may be a chip in the base station in the embodiments of this application, for example, a chip in the base station 100. The communications unit 302 may be an input/output interface, a pin, a circuit, or the like. Optionally, the storage unit may store computer-executable instructions of a method on a base station side, so that the processing unit 301 performs the encoding methods in the foregoing embodiments. The storage unit 303 may be a register, a cache, a RAM, or the like, and the storage unit 303 may be integrated with the processing unit 301. The storage unit 303 may be a ROM or another type of static storage device that can store static information and instructions, and the storage unit 303 may be independent of the processing unit 301. Optionally, with development of wireless communications technologies, the transceiver may be integrated into the encoding apparatus 300. For example, the transceiver 203 and the network interface 204 are integrated into the communications unit 302.

When the encoding apparatus 300 is the base station or the chip in the base station in the embodiments of this application, the encoding method in the foregoing embodiments can be implemented.

Figure 24:
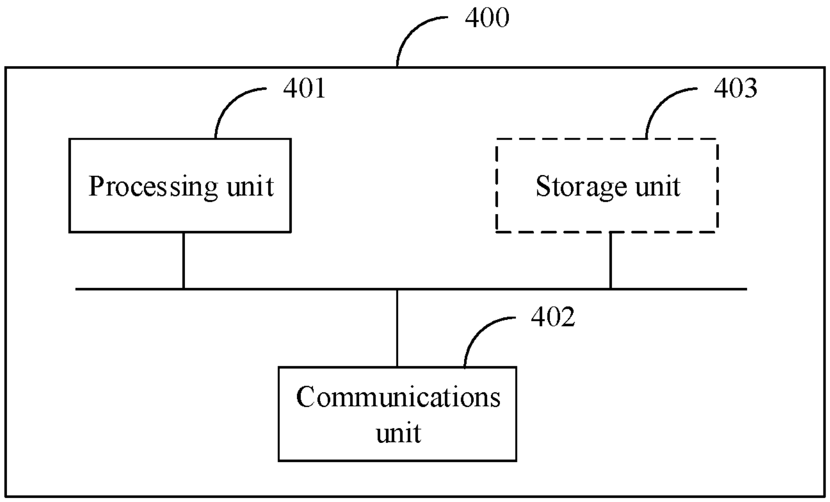
FIG. 24 is a schematic structural diagram of a decoding apparatus according to an embodiment of this application.

The following describes a decoding apparatus 400 provided in an embodiment of this application. The following is shown in FIG. 24.

The decoding apparatus 400 includes a processing unit 401 and a communications unit 402. Optionally, the decoding apparatus 400 further includes a storage unit 403. The processing unit 401, the communications unit 402, and the storage unit 403 are connected by using a communications bus.

The storage unit 403 may include one or more memories. The memory may be a component configured to store a program or data in one or more devices or circuits.

The storage unit 403 may exist independently, and is connected to the processing unit 401 by using the communications bus. The storage unit may alternatively be integrated together with the processing unit 401.

The decoding apparatus 400 may be the terminal in the embodiments of this application, for example, the terminal 200. A schematic diagram of the terminal may be shown in FIG. 2*b*. Optionally, the communications unit 402 of the decoding apparatus 400 may include an antenna and a transceiver of the terminal, for example, the antenna 205 and the transceiver 202 in FIG. 2*b*.

The decoding apparatus 400 may be a chip in the terminal in the embodiments of this application, for example, a chip in the terminal 200. The communications unit 402 may be an input/output interface, a pin, a circuit, or the like. Optionally, the storage unit may store computer-executable instructions of a method on a terminal side, so that the processing unit 401 performs the decoding methods in the foregoing embodiments. The storage unit 403 may be a register, a cache, a RAM, or the like, and the storage unit 403 may be integrated with the processing unit 401. The storage unit 403 may be a ROM or another type of static storage device that can store static information and instructions, and the storage unit 403 may be independent of the processing unit 401. Optionally, with development of wireless communications technologies, the transceiver may be integrated into the decoding apparatus 400. For example, the transceiver 202 is integrated into the communications unit 402.

The decoding apparatus 400 may be the base station in the embodiments of this application, for example, the base station 100. A schematic diagram of the base station 100 may be shown in FIG. 2*a*. Optionally, the communications unit 402 of the decoding apparatus 400 may include an antenna and a transceiver of the base station, for example, the antenna 205 and the transceiver 203 in FIG. 2*a*. The communications unit 402 may further include a network interface of the base station, for example, the network interface 104 in FIG. 2*a*.

The decoding apparatus 400 may be a chip in the base station in the embodiments of this application, for example, a chip in the base station 100. The communications unit 402 may be an input/output interface, a pin, a circuit, or the like. Optionally, the storage unit may store computer-executable instructions of a method on a base station side, so that the processing unit 401 performs the decoding methods in the foregoing embodiments. The storage unit 403 may be a register, a cache, a RAM, or the like, and the storage unit 403 may be integrated with the processing unit 401. The storage unit 403 may be a ROM or another type of static storage device that can store static information and instructions, and the storage unit 403 may be independent of the processing unit 401. Optionally, with development of wireless communications technologies, the transceiver may be integrated into the decoding apparatus 400. For example, the transceiver 203 and the network interface 204 are integrated into the communications unit 402.

When the decoding apparatus 400 is the base station or the chip in the base station in the embodiments of this application, the decoding method in the foregoing embodiments can be implemented.

Figure 25:
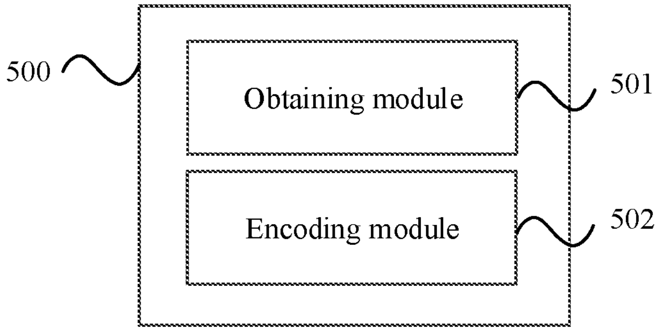
FIG. 25 is a schematic block diagram of an encoding apparatus according to an embodiment of this application.

The following describes an encoding apparatus 500 provided in an embodiment of this application. The following is shown in FIG. 25.

The encoding apparatus 500 includes an obtaining module 501 and an encoding module 502.

The obtaining module 501 is configured to perform a related step of "obtaining input information". For example, the obtaining module 501 supports the encoding apparatus 500 in performing step 704 and step 1404 in the foregoing method embodiments.

The encoding module 502 is configured to perform a related step of "obtaining an encoding neural network". For example, the encoding module 502 supports the encoding apparatus 500 in performing step 701, step 702, step 703, step 1401, step 1402, and step 1403 in the foregoing method embodiments.

In addition, the encoding module 502 may be further configured to perform a related step of "encoding the input information". For example, the encoding module 502 supports the encoding apparatus 500 in performing step 705 and step 1405 in the foregoing method embodiments.

The encoding apparatus 500 may implement other functions of the encoding apparatus in this embodiment of this application by using the obtaining module 501 and the encoding module 502. For details, refer to related content in the foregoing embodiments.

Figure 26:
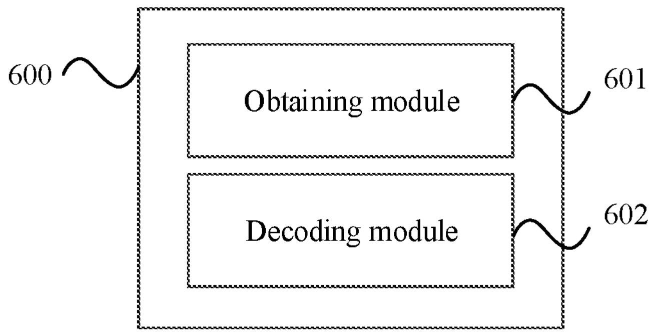
FIG. 26 is a schematic block diagram of a decoding apparatus according to an embodiment of this application.

The following describes a decoding apparatus 600 provided in an embodiment of this application. The following is shown in FIG. 26.

The decoding apparatus 600 includes an obtaining module 601 and a decoding module 602.

The obtaining module 601 is configured to perform a related step of "obtaining input information". For example, the obtaining module 601 supports the decoding apparatus 600 in performing step 2004 in the foregoing method embodiments.

The decoding module 602 is configured to perform a related step of "obtaining a decoding neural network". For example, the decoding module 602 supports the encoding apparatus 600 in performing step 1601, step 1602, and step 1603 in the foregoing method embodiments.

The decoding module 602 may be further configured to perform a related step of "decoding the input information to obtain and output output information". For example, the decoding module 602 supports the decoding apparatus 600 in performing step 2005 in the foregoing method embodiments.

The decoding apparatus 600 may implement other functions of the decoding apparatus in this embodiment of this application by using the obtaining module 601 and the decoding module 602. For details, refer to related content in the foregoing embodiments.

An embodiment of this application further provides a computer-readable storage medium. The methods described in the foregoing embodiments may be all or partially implemented by using software, hardware, firmware, or any combination thereof. If the methods are implemented in software, functions used as one or more instructions or code may be stored in or transmitted on the computer-readable medium. The computer-readable medium may include a computer storage medium and a communications medium, and may further include any medium that can transfer a computer program from one place to another. The storage medium may be any available medium accessible to a computer.

In an optional design, the computer-readable medium may include a RAM, a ROM, an EEPROM, a CD-ROM or another optical disc storage, a magnetic disk storage or another magnetic storage device, or any other medium that can be configured to carry or store required program code in a form of an instruction or a data structure and that may be accessed by the computer. In addition, any connection is appropriately referred to as a computer-readable medium. For example, if a coaxial cable, an optical fiber cable, a twisted pair, a digital subscriber line (DSL), or wireless technologies (such as infrared, radio, and a microwave) are used to transmit software from a website, a server, or another remote source, the coaxial cable, the optical fiber cable, the twisted pair, the DSL or the wireless technologies such as infrared, radio, and a microwave are included in a definition of the medium. Magnetic disks and optical discs used in this specification include a compact disk (CD), a laser disk, an optical disc, a digital versatile disc (DVD), a floppy disk, and a Blu-ray disc. The magnetic disks usually magnetically reproduce data, and the optical discs optically reproduce data by using laser light. The foregoing combinations should also be included within the scope of the computer-readable medium.

An embodiment of this application further provides a computer program product. The methods described in the foregoing embodiments may be all or partially implemented by using software, hardware, firmware, or any combination thereof. When the methods are implemented in software, the methods may be all or partially implemented in a form of a computer program product. The computer program product includes one or more computer instructions. When the foregoing computer program instructions are loaded and executed on a computer, the procedures or functions described in the foregoing method embodiments are all or partially generated. The foregoing computer may be a general-purpose computer, a dedicated computer, a computer network, a network device, user equipment, or other programmable apparatuses.

The foregoing describes the embodiments of this application with reference to the accompanying drawings. However, this application is not limited to the foregoing specific implementations. The foregoing specific implementations are merely examples, and are not limitative. Inspired by this application, a person of ordinary skill in the art may further make many modifications without departing from the purposes of this application and the protection scope of the claims, and all the modifications shall fall within the protection scope of this application.

What is claimed is:

1. An encoding method, comprising:

constructing, by a first communications apparatus in a communications system, a first initial neural network unit, wherein the communications system includes the first communications apparatus and a second communications apparatus;

training, by the first communications apparatus, the first initial neural network unit to obtain a first neural network unit;

after training the first initial neural network unit to obtain the first neural network unit, generating, by the first communications apparatus, an initial encoding neural network based on connecting a plurality of neural network units, wherein the plurality of neural network units comprise the first neural network unit;

training, by the first communications apparatus, the initial encoding neural network to obtain an encoding neural network;

obtaining, by the first communications apparatus, first input information;

encoding, by the first communications apparatus, the first input information based on the encoding neural network to obtain first output information; and transmitting, by the first communications apparatus, the first output information to the second communications apparatus, wherein:

the encoding neural network comprises a first neuron parameter, and the first neuron parameter is used to indicate a mapping relationship between the first input information and the first output information;

the initial encoding neural network comprises a second neuron parameter that is used to indicate a mapping relationship between second input information input to the initial encoding neural network and second output information output by the initial encoding neural network, wherein after the initial encoding neural network is trained, the second neuron parameter is updated to the first neuron parameter;

the second neuron parameter comprises a third neuron parameter comprised in the first neural network unit, wherein the third neuron parameter is used to indicate a mapping relationship between third input information input to the first neural network unit and third output information output by the first neural network unit, wherein an error between the third output information and an expected check result of the third input information is less than a threshold, and wherein the expected check result of the third input information is obtained based on a first kernel matrix, wherein the first kernel matrix is $$\begin{bmatrix} 1 & 1 & 1 \\ 1 & 0 & 1 \\ 0 & 1 & 1 \end{bmatrix};$$

and the first input information is to-be-encoded information, and the second input information and the third input information are training information.

2. The method according to claim 1, wherein training the first initial neural network unit comprises:

setting a first initial neuron parameter, wherein the first initial neuron parameter is used to indicate a mapping relationship between fourth input information input to the first initial neural network unit and fourth output information output by the first initial neuron, wherein the first initial neuron parameter comprises an initial weight value and an initial bias vector, wherein the first initial neural network unit comprises at least one hidden layer, wherein each hidden layer comprises Q nodes, wherein Q is an integer greater than or equal to N, and wherein Nis a minimum value in a code length of the third input information and a code length of the third output information; and training the first initial neural network unit based on the first initial neuron parameter until an error between the fourth output information and an expected check result of the fourth input information is less than a threshold, wherein the expected check result of the fourth input information is obtained based on the first kernel matrix, and when the first initial neural network unit is trained, updating the first initial neuron parameter to obtain the third neuron parameter, wherein the fourth input information is training information.

3. The method according to claim 2, wherein:

the initial encoding neural network comprises the first neural network unit and a second neural network unit; and the second neural network unit comprises a fourth neuron parameter, the second neural network unit is obtained after the first initial neural network unit is trained, the first initial neuron parameter is updated after the first initial neural network unit is trained to obtain the fourth neuron parameter, and the fourth neuron parameter is different from the third neuron parameter.

4. The method according to claim 2, wherein:

the initial encoding neural network comprises the first neural network unit and a third neural network unit, and the third neural network unit comprises a fifth neuron parameter;

the fifth neuron parameter is used to indicate a mapping relationship between fifth input information input to the third neural network unit and fifth output information output by the third neural network unit, an error between the fifth output information and an expected check result of the fifth input information is less than a threshold, and the expected check result of the fifth input information is obtained based on a second kernel matrix; and the fifth input information is training information.

5. The method according to claim 1, wherein:

the expected check result of the third input information is $x_0=u_0 \oplus u_1$, $x_1=u_0 \oplus u_2$, and $x_2=u_0 \oplus u_1 \oplus u_2$, wherein $x_0$, $x_1$, and $x_2$ are the third output information, and wherein $u_0$, $u_1$, and $u_2$ are the third input information.

6. The method according to claim 1, wherein a step of obtaining the initial encoding neural network comprises:

obtaining an encoding network diagram, wherein the encoding network diagram comprises at least one encoding butterfly diagram, and wherein the encoding butterfly diagram is used to indicate a check relationship between input information of the encoding butterfly diagram and output information of the encoding butterfly diagram;

matching the first neural network unit with the at least one encoding butterfly diagram; and replacing a successfully matched encoding butterfly diagram with the first neural network unit to obtain the initial encoding neural network.

7. The method according to claim 1, wherein the plurality of neural network units is generated based on a plurality of kernel matrices with different structures.

8. A decoding method, comprising:

constructing, by a first communications apparatus in a communications system, a first initial neural network unit, wherein the communications system includes the first communications apparatus and a second communications apparatus;

training, by the first communications apparatus, the first initial neural network unit to obtain a first neural network unit;

after training the first initial neural network unit to obtain the first neural network unit, generating, by the first communications apparatus, an initial encoding neural network based on connecting a plurality of neural network units, wherein the plurality of neural network units comprise the first neural network unit;

training, by the first communications apparatus, the initial decoding neural network to obtain a decoding neural network;

receiving, by the first communications apparatus and from the second communications apparatus, first input information; and decoding, by the first communications apparatus, the first input information based on the decoding neural network to obtain and output first output information, wherein:

the decoding neural network comprises a first neuron parameter, and the first neuron parameter is used to indicate a mapping relationship between the first input information and the first output information;

the initial decoding neural network comprises a second neuron parameter that is used to indicate a mapping relationship between second input information input to the initial decoding neural network and second output information output by the initial decoding neural network, wherein after the initial decoding neural network is trained, the second neuron parameter is updated to the first neuron parameter;

the second neuron parameter comprises a third neuron parameter comprised in the first neural network unit, wherein the third neuron parameter is used to indicate a mapping relationship between third input information input to the first neural network unit and third output information output by the first neural network unit, wherein an error between the third output information and an expected check result of the third input information is less than a threshold, and wherein the expected check result of the third input information is obtained based on a first kernel matrix, wherein the first kernel matrix is $$\begin{bmatrix} 1 & 1 & 1 \\ 1 & 0 & 1 \\ 0 & 1 & 1 \end{bmatrix};$$

and the first input information is to-be-decoded information, and the second input information and the third input information are training information.

9. The method according to claim 8, wherein training the first initial neural network unit comprises:

setting a first initial neuron parameter, wherein the first initial neuron parameter is used to indicate a mapping relationship between fourth input information input to the first initial neuron and fourth output information output by the first initial neuron, wherein the first initial neuron parameter comprises an initial weight value and an initial bias vector, wherein the first initial neural network unit comprises at least one hidden layer, wherein each hidden layer comprises Q nodes, wherein Q is an integer greater than or equal to N, and wherein N is a minimum value in a code length of the third input information and a code length of the third output information; and training the first initial neural network unit based on the first initial neuron parameter until an error between the fourth output information and an expected check result of the fourth input information is less than a threshold, wherein the expected check result of the fourth input information is obtained based on the first kernel matrix, and when the first initial neural network unit is trained, updating the first initial neuron parameter to obtain the third neuron parameter, wherein the fourth input information is training information.

10. The method according to claim 9, wherein:

the initial decoding neural network comprises the first neural network unit and a second neural network unit; and the second neural network unit comprises a fourth neuron parameter, the second neural network unit is obtained after the first initial neural network unit is trained, the first initial neuron parameter is updated after the first initial neural network unit is trained to obtain the fourth neuron parameter, and the fourth neuron parameter is different from the third neuron parameter.

11. The method according to claim 9, wherein:

the initial decoding neural network comprises the first neural network unit and a third neural network unit, and the third neural network unit comprises a fifth neuron parameter;

the fifth neuron parameter is used to indicate a mapping relationship between fifth input information input to the third neural network unit and fifth output information output by the third neural network unit, an error between the fifth output information and an expected check result of the fifth input information is less than a threshold, and the expected check result of the fifth input information is obtained based on a second kernel matrix; and the fifth input information is training information.

12. The method according to claim 8, wherein:

the expected check result of the third input information is $x_0=y_0 \oplus y_1$, $x_1=y_0 \oplus y_2$, and $x_2=y_0 \oplus y_1 \oplus y_2$, wherein $x_0$, $x_1$, and $x_2$ are the third output information, and wherein $y_0$, $y_1$, and $y_2$ are the third input information.

13. The method according to claim 8, wherein a step of obtaining the initial decoding neural network comprises:

obtaining a decoding network diagram, wherein the decoding network diagram comprises at least one decoding butterfly diagram, and wherein the decoding butterfly diagram is used to indicate a check relationship between input information of the decoding butterfly diagram and output information of the decoding butterfly diagram;

matching the first neural network unit with the at least one decoding butterfly diagram; and replacing a successfully matched decoding butterfly diagram with the first neural network unit to obtain the initial decoding neural network.

14. The method according to claim 8, wherein the plurality of neural network units is generated based on a plurality of kernel matrices with different structures.

15. An encoding apparatus, comprising:

at least one processor; and one or more memories coupled to the at least one processor and storing programming instructions for execution by the at least one processor to:

construct a first initial neural network unit, wherein a communications system includes the encoding apparatus and a decoding apparatus;

train the first initial neural network unit to obtain a first neural network unit;

after training the first initial neural network unit to obtain the first neural network unit, generate an initial encoding neural network based on connecting a plurality of neural network units, wherein the plurality of neural network units comprise the first neural network unit;

train the initial encoding neural network to obtain an encoding neural network;

obtain first input information;

encode the first input information based on the encoding neural network to obtain first output information; and transmit the first output information to the decoding apparatus, wherein:

the encoding neural network comprises a first neuron parameter, and the first neuron parameter is used to indicate a mapping relationship between the first input information and the first output information;

the initial encoding neural network comprises a second neuron parameter that is used to indicate a mapping relationship between second input information input to the initial encoding neural network and second output information output by the initial encoding neural network, wherein after the initial encoding neural network is trained, the second neuron parameter is updated to the first neuron parameter;

the second neuron parameter comprises a third neuron parameter comprised in the first neural network unit, wherein the third neuron parameter is used to indicate a mapping relationship between third input information input to the first neural network unit and third output information output by the first neural network unit, wherein an error between the third output information and an expected check result of the third input information is less than a threshold, and wherein the expected check result of the third input information is obtained based on a first kernel matrix, wherein the first kernel matrix is $$\begin{bmatrix} 1 & 1 & 1 \\ 1 & 0 & 1 \\ 0 & 1 & 1 \end{bmatrix};$$

and the first input information is to-be-encoded information, and the second input information and the third input information are training information.

16. The apparatus according to claim 15, wherein the programming instructions are for execution by the at least one processor to:

set a first initial neuron parameter, wherein the first initial neuron parameter is used to indicate a mapping relationship between fourth input information input to the first initial neuron and fourth output information output by the first initial neuron, wherein the first initial neuron parameter comprises an initial weight value and an initial bias vector, wherein the first initial neural network unit comprises at least one hidden layer, wherein each hidden layer comprises Q nodes, wherein Q is an integer greater than or equal to N, and wherein Nis a minimum value in a code length of the third input information and a code length of the third output information; and train the first initial neural network unit based on the first initial neuron parameter until an error between the fourth output information and an expected check result of the fourth input information is less than a threshold, wherein the expected check result of the fourth input information is obtained based on the first kernel matrix, and when the first initial neural network unit is trained, update the first initial neuron parameter to obtain the third neuron parameter, wherein the fourth input information is training information.

17. The apparatus according to claim 16, wherein:

the initial encoding neural network comprises the first neural network unit and a second neural network unit; and the second neural network unit comprises a fourth neuron parameter, the second neural network unit is obtained after the first initial neural network unit is trained, the first initial neuron parameter, after the first initial neural network unit is trained, is updated to obtain the fourth neuron parameter, and the fourth neuron parameter is different from the third neuron parameter.

18. The apparatus according to claim 15, wherein:

the expected check result of the third input information is $x_0=u_0 \oplus u_1$, $x_1=u_0 \oplus u_2$, and $x_2=u_0 \oplus u_1 \oplus u_2$, wherein $x_0$, $x_1$, and $x_2$ are the third output information, and wherein $u_0$, $u_1$, and $u_2$ are the third input information.

19. The apparatus according to claim 15, wherein the plurality of neural network units is generated based on a plurality of kernel matrices with different structures.

20. The apparatus according to claim 15, wherein the programming instructions are for execution by the at least one processor to:

obtain an encoding network diagram, wherein the encoding network diagram comprises at least one encoding butterfly diagram, and wherein the encoding butterfly diagram is used to indicate a check relationship between input information of the encoding butterfly diagram and output information of the encoding butterfly diagram;

match the first neural network unit with the at least one encoding butterfly diagram; and replace a successfully matched encoding butterfly diagram with the first neural network unit to obtain the initial encoding neural network.

* * * * *